US012598705B2

(12) United States Patent
Katsumata et al.

(10) Patent No.: US 12,598,705 B2
(45) Date of Patent: Apr. 7, 2026

(54) WIRING BOARD, LIGHT EMITTING DEVICE, AND METHOD FOR MANUFACTURING THEREOF

(71) Applicant: NICHIA CORPORATION, Anan (JP)

(72) Inventors: Masaaki Katsumata, Anan (JP); Takashi Kuraoka, Anan (JP); Eiko Minato, Anan (JP)

(73) Assignee: NICHIA CORPORATION, Anan (JP)

( * ) Notice: Subject to any disclaimer, the term of this patent is extended or adjusted under 35 U.S.C. 154(b) by 822 days.

(21) Appl. No.: 17/954,327

(22) Filed: Sep. 28, 2022

(65) Prior Publication Data

US 2023/0105906 A1 Apr. 6, 2023

(30) Foreign Application Priority Data

Sep. 30, 2021 (JP) ................................. 2021-162370

(51) Int. Cl.
$H05K\ 3/00$ (2006.01)
$H01B\ 1/22$ (2006.01)
(Continued)

(52) U.S. Cl.
CPC ........... H05K 3/0035 (2013.01); H05K 1/092 (2013.01); H05K 1/11 (2013.01); H05K 3/0026 (2013.01);
(Continued)

(58) Field of Classification Search
CPC ............. H10H 20/0364; H10H 20/857; H05K 2203/108; H05K 2203/025;
(Continued)

(56) References Cited

U.S. PATENT DOCUMENTS

| | | | |
|---|---|---|---|
| 2002/0180029 A1* | 12/2002 | Higashitani | H01L 21/563 257/E23.068 |
| 2004/0104042 A1* | 6/2004 | Takase | H05K 3/462 361/792 |

(Continued)

FOREIGN PATENT DOCUMENTS

| | | |
|---|---|---|
| JP | 59-163888 | 9/1984 |
| JP | 2001-274557 | 10/2001 |

(Continued)

*Primary Examiner* — Eliseo Ramos Feliciano
*Assistant Examiner* — Adam Joseph Mott
(74) *Attorney, Agent, or Firm* — MORI & WARD, LLP

(57) ABSTRACT

A method for manufacturing a wiring board that includes preparing a substrate including an insulating resin and a metal member having an anti-rust layer formed on a surface thereof that is arranged so as to face a second surface of the insulating resin. The method includes forming a bottomed hole by irradiating a first laser beam from a first surface side of the insulating resin. The bottomed hole penetrates the insulating resin and has an inner bottom surface that is the surface of the metal member. The method also includes removing the anti-rust layer formed on the surface of the metal member in the inner bottom surface of the bottomed hole, injecting a conductive paste into the bottomed hole and applying the conductive paste to the first surface of the insulating resin so as to have a wiring continuous with the injected conductive paste, and curing the conductive paste.

20 Claims, 22 Drawing Sheets

(51) Int. Cl.

| | |
|---|---|
| *H05K 1/09* | (2006.01) |
| *H05K 1/11* | (2006.01) |
| *H05K 3/12* | (2006.01) |
| *H05K 3/38* | (2006.01) |
| *H05K 3/40* | (2006.01) |
| *H05K 3/46* | (2006.01) |
| *H10H 20/01* | (2025.01) |
| *H10H 20/814* | (2025.01) |
| *H10H 20/857* | (2025.01) |

(52) U.S. Cl.
CPC ............. *H05K 3/0032* (2013.01); *H05K 3/12* (2013.01); *H05K 3/1216* (2013.01); *H05K 3/1225* (2013.01); *H05K 3/1283* (2013.01); *H05K 3/4038* (2013.01); *H05K 3/4069* (2013.01); *H05K 3/4664* (2013.01); *H10H 20/0364* (2025.01); *H10H 20/814* (2025.01); *H10H 20/857* (2025.01); *H01B 1/22* (2013.01); *H05K 3/0038* (2013.01); *H05K 3/382* (2013.01); *H05K 3/384* (2013.01); *H05K 3/4652* (2013.01); *H05K 2201/0154* (2013.01); *H05K 2201/09509* (2013.01); *H05K 2201/09627* (2013.01); *H05K 2201/0979* (2013.01); *H05K 2201/09827* (2013.01); *H05K 2201/10106* (2013.01); *H05K 2203/025* (2013.01); *H05K 2203/0307* (2013.01); *H05K 2203/0361* (2013.01); *H05K 2203/107* (2013.01); *H05K 2203/108* (2013.01); *H05K 2203/1453* (2013.01)

(58) Field of Classification Search
CPC ......... H05K 2203/0361; H05K 3/0035; H05K 3/0038; H05K 3/382; H05K 3/384; H05K 2201/09827; H05K 2203/107; H05K 2201/09509; H05K 2203/0307
See application file for complete search history.

(56) References Cited

U.S. PATENT DOCUMENTS

| | | | |
|---|---|---|---|
| 2005/0142693 A1 | 6/2005 | Higashitani et al. | |
| 2006/0068581 A1 | 3/2006 | Kobayashi | |
| 2014/0353025 A1 | 12/2014 | Jang et al. | |
| 2016/0035643 A1 | 2/2016 | Higashidate | |
| 2017/0223827 A1* | 8/2017 | Yamada | H05K 1/189 |
| 2019/0049649 A1 | 2/2019 | Hayashi et al. | |
| 2019/0270165 A1* | 9/2019 | Takada | B32B 15/088 |
| 2020/0343407 A1* | 10/2020 | Minato | H10H 20/01 |
| 2020/0355865 A1 | 11/2020 | Hayashi et al. | |
| 2021/0167046 A1* | 6/2021 | Minato | H10H 20/851 |
| 2024/0188216 A1* | 6/2024 | Iida | H05K 3/4623 |

FOREIGN PATENT DOCUMENTS

| | | | | |
|---|---|---|---|---|
| JP | 2002-252464 | 9/2002 | | |
| JP | 2003-017529 | 1/2003 | | |
| JP | 2003142805 A * | 5/2003 | | |
| JP | 2004-074211 | 3/2004 | | |
| JP | 2004-148344 | 5/2004 | | |
| JP | 2004-223533 | 8/2004 | | |
| JP | 2004-344961 | 12/2004 | | |
| JP | 2006-210514 | 8/2006 | | |
| JP | 2006-253424 | 9/2006 | | |
| JP | 2007-157900 | 6/2007 | | |
| JP | 2010-219324 | 9/2010 | | |
| JP | 2011-091320 | 5/2011 | | |
| JP | 2011-134829 | 7/2011 | | |
| JP | 2011-146408 | 7/2011 | | |
| JP | 2011146408 A * | 7/2011 | .......... | H05K 3/4602 |
| JP | 2012-079766 | 4/2012 | | |
| JP | 2012079766 A * | 4/2012 | | |
| JP | 2014-165483 | 9/2014 | | |
| JP | 2014-232862 | 12/2014 | | |
| JP | 2016-033952 | 3/2016 | | |
| JP | 2019-012681 | 1/2019 | | |
| JP | 2019-153697 | 9/2019 | | |
| JP | 2020-202344 | 12/2020 | | |
| WO | WO 2005/034595 | 4/2005 | | |

* cited by examiner

MANUFACTURING WIRING BOARD — S10 , S110

DISPOSING LIGHT REFLECTION MEMBER — S131B

FORMING THROUGH HOLE — S132B

DISPOSING LIGHT SOURCE — S121B

DISPOSING CONNECTION MEMBER — S122B

DISPOSING FIRST LIGHT GUIDE MEMBER — S141

DISPOSING SECOND LIGHT GUIDE MEMBER — S142

S140

DISPOSING LIGHT ADJUSTMENT MEMBER — S150

WIRING BOARD, LIGHT EMITTING DEVICE, AND METHOD FOR MANUFACTURING THEREOF

CROSS-REFERENCE TO RELATED APPLICATION

This application claims priority to Japanese Patent Application No. 2021-162370 filed on Sep. 30, 2021, the disclosure of which is hereby incorporated by reference in its entirety.

BACKGROUND

The present disclosure relates to a wiring board, a light emitting device, and a method for manufacturing thereof.

Vias filled with a conductive paste may be adopted as interlayer wiring of a multilayer wiring board. For example, Japanese Patent Publication No. 2006-210514A describes a double-sided wiring board having wiring made of copper foil on both sides of the board and using vias filled with a conductive paste as interlayer wiring.

SUMMARY

According to a first aspect of the present invention, a method for manufacturing a wiring board includes: preparing a substrate including an insulating resin having a first surface and a second surface on an opposite side to the first surface, and a metal member having an anti-rust layer formed on a surface thereof that is arranged so as to face the second surface of the insulating resin; forming a bottomed hole by irradiating a first laser beam from a first surface side of the insulating resin, the bottomed hole penetrating the insulating resin and having an inner bottom surface that is the surface of the metal member; removing the anti-rust layer formed on the surface of the metal member in the inner bottom surface of the bottomed hole; injecting a conductive paste into the bottomed hole and applying the conductive paste to the first surface of the insulating resin so as to have a wiring continuous with the injected conductive paste; and curing the conductive paste.

According to a second aspect of the present invention, a method for manufacturing a planar light emitting device includes: manufacturing a wiring board by the method for manufacturing the wiring board according to the first aspect; disposing a light source including a light emitting element on the metal member; disposing a light reflection member so as to cover the metal member; and disposing a first light guide member so as to cover the light reflection member.

According to a third aspect of the present invention, a method for manufacturing a planar light emitting device includes: manufacturing a wiring board by the method for manufacturing the wiring board according to the first aspect; disposing a light reflection member so as to cover the first surface of the insulating resin and the conductive paste; disposing a light source including a light emitting element on the first surface side of the insulating resin; disposing a light guide member so as to cover the light source and the light reflection member; and disposing a light adjustment member in a position overlapping with the light source on the surface of the light guide member when viewed in a plan view.

According to a fourth aspect of the present invention, a wiring board includes: a substrate including an insulating resin having a first surface and a second surface on an opposite side to the first surface, and a metal member having an anti-rust layer formed on a surface thereof that is arranged so as to face the second surface of the insulating resin; and a conductive paste disposed on the substrate. Here, the substrate has a bottomed hole that penetrates the insulating resin and has an inner bottom surface that is the surface of the metal member on an insulating resin side. The inner bottom surface of the bottomed hole has a region where the anti-rust layer is removed. The conductive paste is positioned inside the bottomed hole so as to face the region where the anti-rust layer is removed, and is arranged on the first surface of the insulating resin so as to have a wiring continuous with the conductive paste positioned inside the bottomed hole.

According to a fifth aspect of the present invention, a planar light emitting device includes: a wiring board according to the fourth aspect; a light source including a light emitting element disposed on the metal member; a light reflection member that covers the metal member; and a first light guide member that covers the light reflection member.

According to a sixth aspect of the present invention, a planar light emitting device includes: a wiring board according to the fourth aspect; a light reflection member that covers the first surface of the insulating resin and the conductive paste in the wiring board; a light source including a light emitting element disposed on a first surface side of the insulating resin; a light guide member that covers the light source and the light reflection member; and a light adjustment member arranged in a position overlapping with the light source on the surface of the light guide member when viewed in a plan view.

BRIEF DESCRIPTION OF THE DRAWINGS

A more complete appreciation of embodiments of the invention and many of the attendant advantages thereof will be readily obtained by reference to the following detailed description when considered in connection with the accompanying drawings.

FIG. 11 is a schematic cross-sectional view taken along the line XI-XI in FIG. 6B, showing the planar light emitting device according to the second embodiment.

DETAILED DESCRIPTION OF THE EMBODIMENTS

Figure 1A:
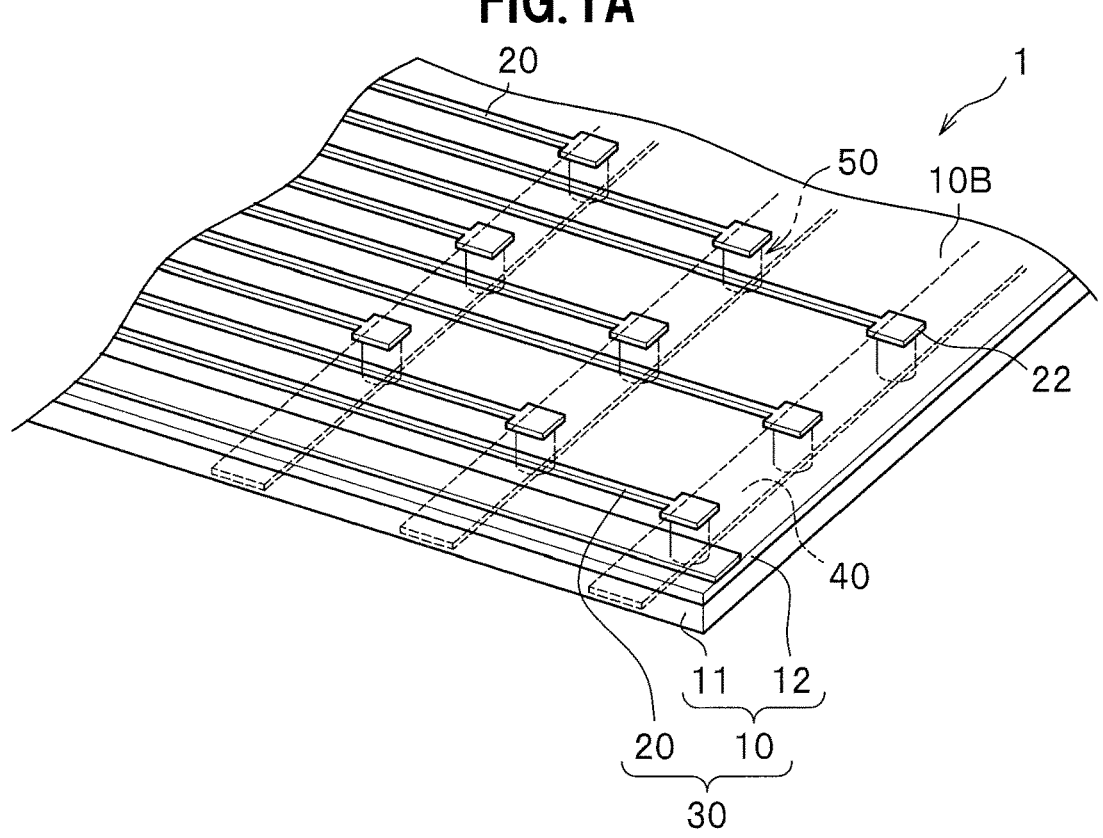
FIG. 1A is a schematic perspective view of a second surface side showing a part of a wiring board according to an embodiment.

Embodiments of the present disclosure will be hereinafter described with reference to the accompanying drawings. However, the embodiments described below are intended to embody the technical idea according to the present disclosure, and the disclosure is not limited to the following unless otherwise specified. The content described in one embodiment is also applicable to other embodiments and modified examples. In addition, the drawings schematically show an embodiment, and in order to clarify the explanation, the scale, spacing, positional relationship, and the like of each member may be exaggerated, or the illustration of the members may be partially omitted. The directions shown in each drawing indicate relative positions between the components and are not intended to indicate absolute positions. Note that the same names and reference numerals denote, in principle, the same members or those of the same nature, and detailed description thereof will be omitted as appropriate. Further, "covering" in the embodiment is not limited to the case of direct contact, but also includes the case of indirectly covering, for example, via another member.

[Wiring Board]

Figure 1B:
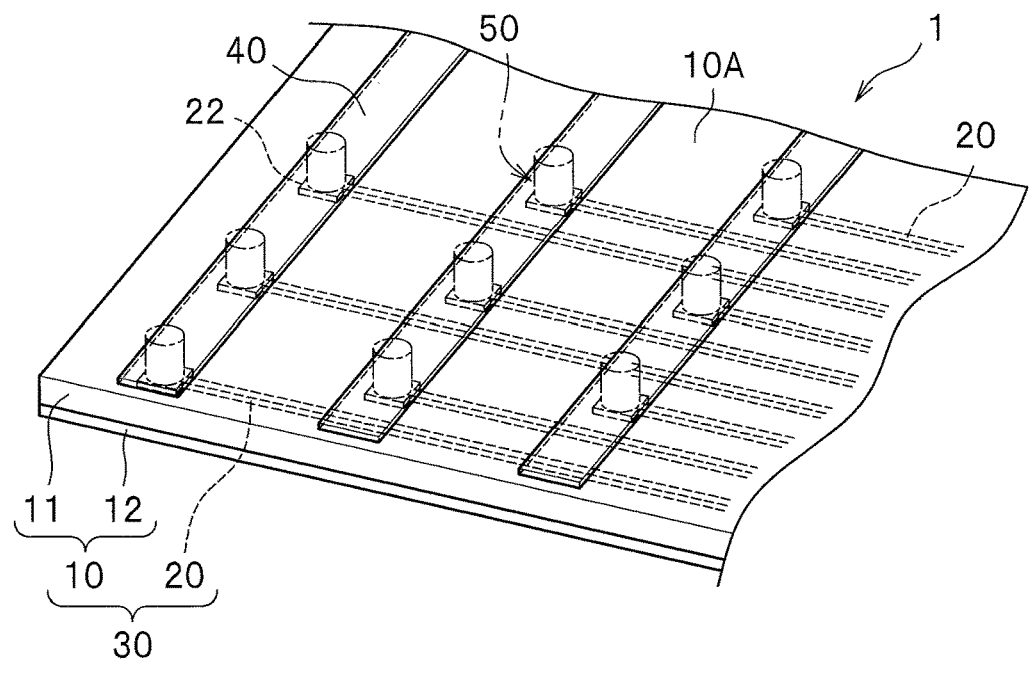
FIG. 1B is a schematic perspective view of a first surface side showing a part of the wiring board according to the embodiment.
Figure 1C:
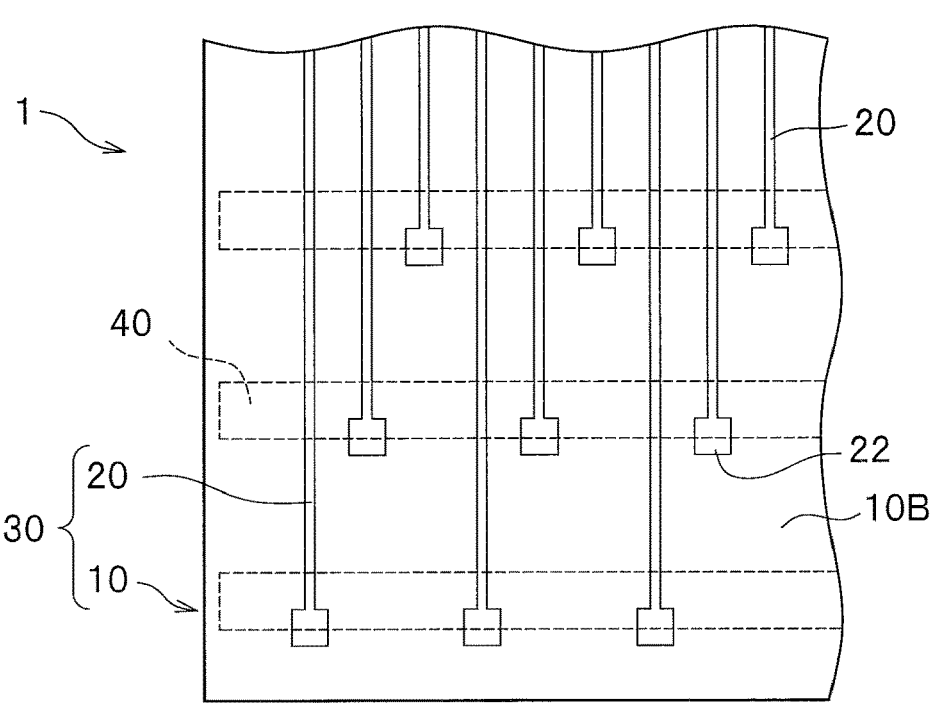
FIG. 1C is a schematic plan view of the second surface side showing a part of the wiring board according to the embodiment.
Figure 1D:
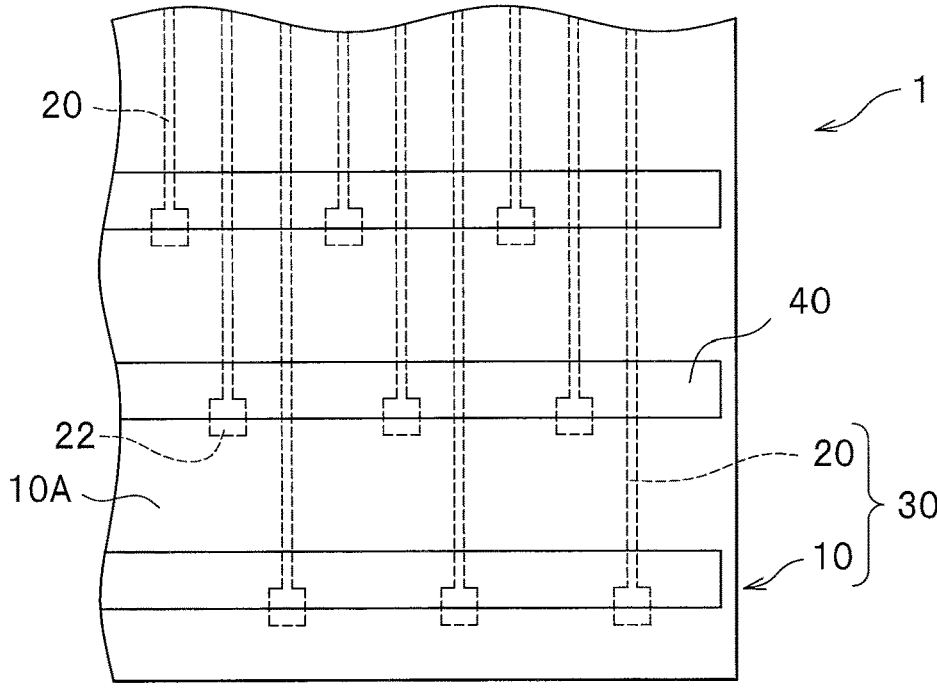
FIG. 1D is a schematic plan view of the first surface side showing a part of the wiring board according to the embodiment.
Figure 2A:
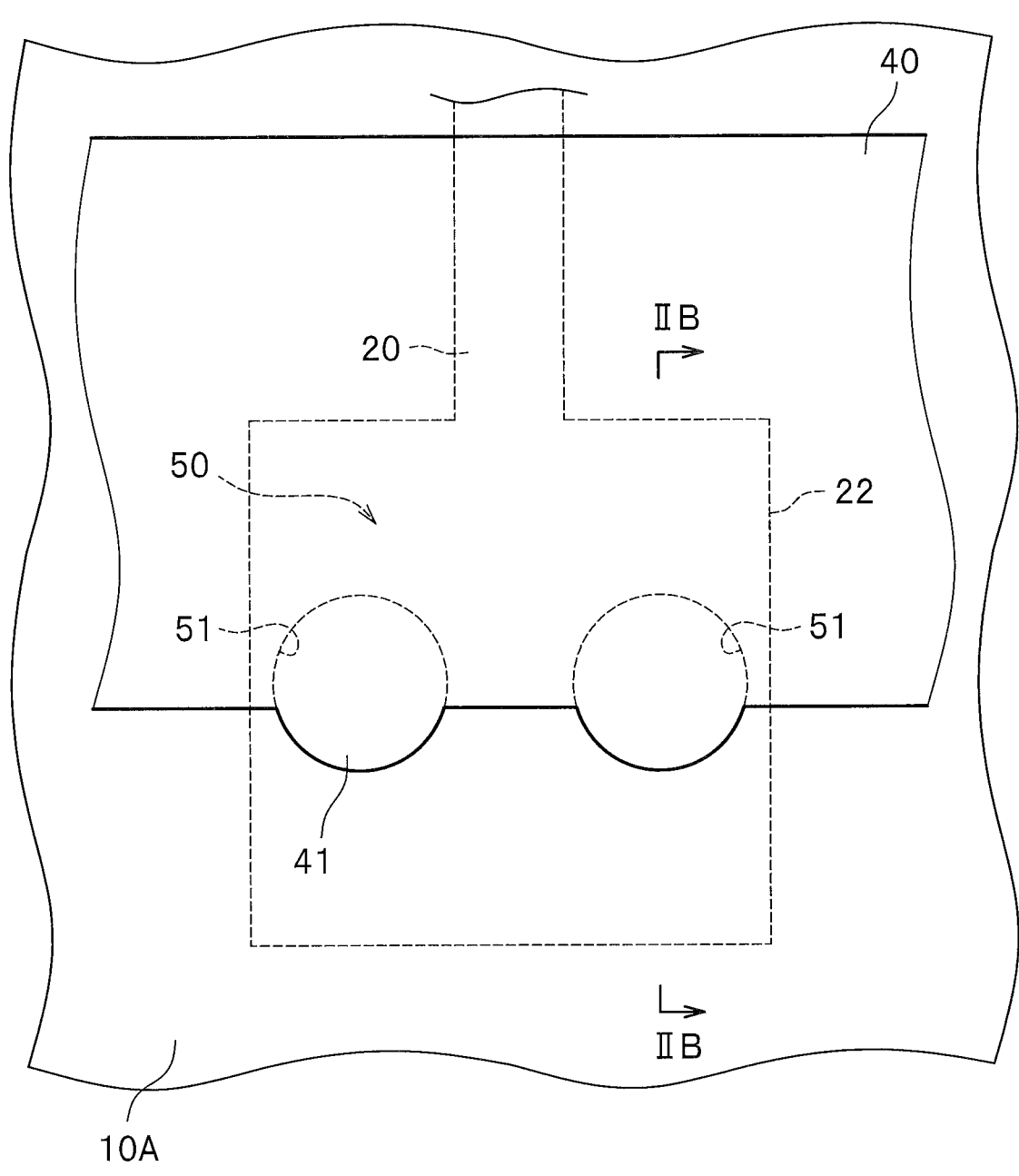
FIG. 2A is a schematic plan view of the first surface side showing a via connector according to the embodiment.
Figure 2B:
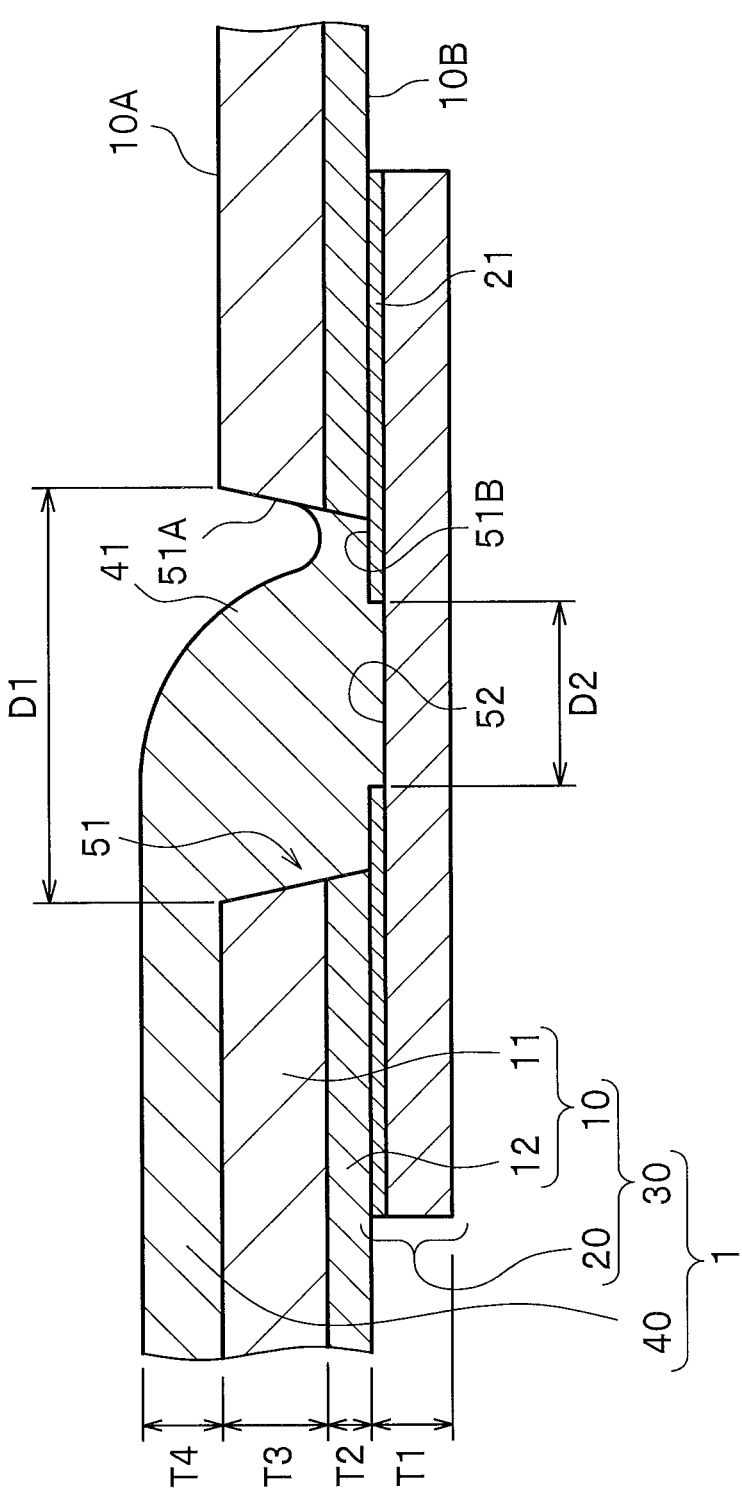
FIG. 2B is a schematic cross-sectional view taken along the line IIB-IIB in FIG. 2A.

A wiring board 1 according to an embodiment will be described with reference to FIGS. 1A to 2B. FIG. 1A is a schematic perspective view of a second surface side showing a part of the wiring board according to the embodiment. FIG. 1B is a schematic perspective view of a first surface side showing a part of the wiring board according to the embodiment. FIG. 1C is a schematic plan view of the second surface side showing a part of the wiring board according to the embodiment. FIG. 1D is a schematic plan view of the first surface side showing a part of the wiring board according to the embodiment. FIG. 2A is a schematic plan view of the first surface side showing a via connector according to the embodiment. FIG. 2B is a schematic cross-sectional view taken along the line IIB-IIB in FIG. 2A.

As shown in FIGS. 1A to 1D, the wiring board 1 can be provided with electrical wiring having different patterns on both sides. The wiring on both sides is connected by a via connector 50. Wiring formed using a metal member 20 to be described later is provided on one side of the wiring board 1, and wiring formed using a conductive paste 40 to be described later is provided on the opposite side. The via connector 50 has a bottomed hole 51 to be described later, and the wiring on both sides is connected by the conductive paste 40. FIG. 2A shows an enlarged view of an example of the via connector 50.

The wiring board 1 includes a substrate 30 and the conductive paste 40 disposed on the substrate 30. The substrate 30 includes: an insulating resin 10 having a first surface 10A and a second surface 10B on the side opposite to the first surface 10A; and a metal member 20 which is arranged so as to face the second surface 10B of the insulating resin 10 and has an anti-rust layer 21 formed on its surface on the second surface 10B side. The substrate 30 has the bottomed hole 51 that penetrates the insulating resin 10. The bottomed hole 51 has an inner bottom surface 51B that is the surface on the insulating resin 10 side in the metal member 20. The inner bottom surface 51B of the bottomed hole 51 has a region 52 where the anti-rust layer 21 is removed, and the conductive paste 40 is located inside the bottomed hole 51 so as to face the region 52 where the anti-rust layer 21 is removed, and is arranged on the first surface 10A of the insulating resin 10 so as to have wiring continuous with the conductive paste 40 located inside the bottomed hole 51. Next, each configuration of the wiring board 1 will be described.

(Substrate)

The substrate 30 is a plate-shaped or sheet-shaped member that is the basis of the wiring board 1. The substrate 30 has a rectangular shape, for example, in a plan view. The shape of the substrate 30 in the plan view is not particularly limited. The substrate 30 has the insulating resin 10 and the metal member 20 that serves as a wiring arranged so as to face the second surface 10B of the insulating resin 10. The conductive paste 40 that serves as a wiring is arranged on the first surface 10A of the insulating resin 10. The wiring of the metal member 20 and the wiring of the conductive paste 40 are connected through the via connector 50 (through hole and conductive paste) which is formed so as to penetrate the insulating resin 10 and serves as a wiring.

(Insulating Resin)

The insulating resin 10 is an insulating plate-shaped or sheet-shaped member that serves as a base on which a wiring pattern is formed. The insulating resin 10 has the first surface 10A and the second surface 10B on the side opposite to the first surface 10A, and has the bottomed hole 51 formed therein, which is a through hole penetrating from the first surface 10A to the second surface 10B. Here, the insulating resin 10 is formed of two layers, a polyimide layer 11 and a resin layer 12, with the polyimide layer 11 side being the first surface 10A and the resin layer 12 side being the second surface 10B. The polyimide layer 11 has a thickness T3 of, for example, 12 μm to 75 μm, and the resin layer 12 has a thickness T2 of, for example, 5 μm to 20 μm. The material, structure, and thickness of the insulating resin 10 are not particularly limited.

(Metal Member)

The metal member 20 is a conductive member that forms a preset wiring pattern. The material of the metal member 20 can be, for example, a single-component metal such as Ag, Al, Ni, Au, Cu, Ti, Pt, and W or an alloy containing these. Here, a copper foil is used as an example of the metal member 20. The copper foil has a thickness T1 of, for example, 12 μm to 35 μm. The wiring pattern of the metal member 20 can be formed by etching.

The metal member 20 can be provided with a connection pad portion 22. The connection pad portion 22 is a part of the metal member 20. The connection pad portion 22 is formed to have a large width, for example, so that the via connector 50 can be easily provided. Here, the rectangular connection pad portion 22 is provided at the tip of the wiring pattern of the metal member 20 and is arranged so as to have a region that overlaps with the wiring of the conductive paste 40 to be described later in a plan view. The connection pad portion 22 can be formed by etching together with the wiring pattern.

The metal member 20 has its surface made rust-proof. Particularly, the anti-rust layer 21 is formed on the surface facing the insulating resin 10. The anti-rust layer 21 is formed of, for example, a roughened layer having its surface roughened, a plated layer such as Zn, Ni, and Cr, an organic film layer, or the like, and forms the surface of the copper foil as the metal member 20. The anti-rust layer 21 suppresses oxidation of the metal member 20 such as a copper foil and enhances the adhesion to the insulating resin 10. However, the anti-rust layer 21 has a larger electrical resistance than the copper foil. Therefore, when an electric contact is to be provided on the surface of the copper foil facing the insulating resin 10, it is preferable that the anti-rust layer 21 is removed in order to reduce the electrical resistance at the electric contact. The anti-rust layer 21 can be removed by, for example, irradiating with a laser beam to evaporate, a chemical reaction with a reducing agent, mechanical grinding, or the like. The anti-rust layer 21 has a thickness of, for example, 0.1 μm to 7 μm. The area where the anti-rust layer 21 is removed can be 20% or more, preferably 40% or more, more preferably 55% or more, and even more preferably 70% or more, with respect to the inner bottom surface 51B of the bottomed hole 51. The area where the anti-rust layer 21 is removed is preferably 80% or less with respect to the inner bottom surface 51B of the bottomed hole 51. The area where the anti-rust layer 21 is removed can be 100% of the inner bottom surface 51B of the bottomed hole 51. Thus, the electrical resistance between the conductive paste 40 and the metal member 20 can be reduced. Moreover, the area where the anti-rust layer 21 is removed can be not only one place but also a plurality of places in the bottomed hole 51. Further, irregularities can be provided on the surface of the metal member 20 in the region where the anti-rust layer 21 is removed. For example, fine irregularities are formed on the surface of the metal member 20 when the anti-rust layer 21 is removed by a laser or the like. These fine irregularities can strengthen the bonding between the conductive paste 40 and the metal member 20. In the region where the anti-rust layer 21 is removed, the metal member 20 has a surface roughness (Ra) of preferably 0.1 µm to 3.0 µm, more preferably 0.2 µm to 1.5 µm.

(Conductive Paste)

The conductive paste 40 is a member that forms the wiring arranged on the first surface 10A and connects the wiring arranged on the first surface 10A to the metal member 20 arranged facing the second surface 10B. The conductive paste 40 is arranged as the wiring on the first surface 10A, and is also arranged in the bottomed hole 51 to be described later.

The copper foil has a volume resistivity of, for example, 1.7 µΩ·cm, whereas the conductive paste 40 has a volume resistivity of, for example, 10 µΩ·cm to 100 µΩ·cm. In order to reduce the wiring resistance of the conductive paste 40, the cross-sectional area of the wiring can be increased. As for the wiring arranged on the first surface 10A, the conductive paste 40 has a wiring thickness T4 of, for example, 10 µm to 30 µm in order to make the wiring board 1 as thin as possible. Therefore, it is preferable that the conductive paste 40 has a wiring width of 0.5 mm to 2 mm.

The material of the conductive paste 40 is, for example, a simple substance such as gold, silver, copper, platinum, and aluminum, or an alloy thereof, or a mixture of a mixed powder and a resin binder. As the resin binder, for example, a thermosetting resin such as an epoxy resin or a silicone resin can be used. Further, it is preferable that the conductive paste 40 contains a reducing agent such as an organic acid. This makes it possible to reduce the electrical resistance at the connection with the metal member 20.

(Bottomed Hole)

The bottomed hole 51 is configured as a bottomed hole by penetrating the insulating resin 10 to form a through hole and closing the through hole with the metal member 20. The bottomed hole 51 is provided in a position facing the metal member 20, and the surface of the metal member 20 serves as the inner bottom surface 51B of the bottomed hole 51. Here, two bottomed holes 51 are provided in positions facing one connection pad portion 22.

(Region where Anti-Rust Layer is Removed)

The region 52 where the anti-rust layer 21 is removed is a part of the inner bottom surface 51B of the bottomed hole 51, and is a region where the anti-rust layer 21 of the metal member 20 is removed. Here, the region 52 is provided in the center of the inner bottom surface 51B.

In the wiring board 1, the substrate 30 has a plurality of bottomed holes 51 arranged in parallel, each having its surface on the insulating resin 10 side in the continuous metal member 20 as the inner bottom surface 51B. The conductive paste 40 in contact with each of the inner bottom surfaces 51B of the plurality of bottomed holes 51 arranged in parallel is continuous via the wiring of the conductive paste 40 arranged on the first surface 10A of the insulating resin 10.

Here, as shown in FIG. 2A, two bottomed holes 51 are provided in parallel for one connection pad portion 22 formed of the continuous metal member 20. That is, the two bottomed holes 51 has the metal member 20 continuous in their inner bottom surfaces 51B. The continuous conductive paste 40 in the wiring on the first surface 10A is in contact with the region 52 where the anti-rust layer 21 is removed on each inner bottom surface 51B.

Further, in a plan view, the conductive paste 40 has a filler portion 41 formed therein, which is provided so as to be continuous with the conductive paste 40 and to overrun a certain width and enter into the bottomed hole 51.

The wiring board 1 having the configuration as described above has the bottomed hole 51 that penetrates the insulating resin 10 and has the inner bottom surface 51B that is the surface of the metal member 20 on the insulating resin 10 side. The conductive paste 40 located inside the bottomed hole 51 makes it possible to ensure the electrical connection between the conductive paste 40 and the metal member 20.

The wiring board 1 has the region 52 where the anti-rust layer 21 is removed on the inner bottom surface 51B of the bottomed hole 51, and the conductive paste 40 is located inside the bottomed hole 51 so as to face the region 52 where the anti-rust layer 21 is removed, thus making it possible to reduce the electrical resistance at the connection between the conductive paste 40 and the metal member 20.

The wiring board 1 has the conductive paste 40 located inside the bottomed hole 51 continuous with the conductive paste 40 arranged on the first surface 10A of the insulating resin 10. Thus, via filling and wiring can be performed with one member, making it possible to suppress an increase in kinds of members in the double-sided substrate.

In the wiring board 1, the conductive paste 40 in contact with the inner bottom surface 51B of each of the plurality of bottomed holes 51 arranged in parallel is continuous through the wiring of the conductive paste 40 arranged on the first surface 10A of the insulating resin 10. This makes it possible to further ensure the electrical connection between the conductive paste 40 and the metal member 20 and to further reduce the electrical resistance at the connection.

The shape of the connection pad portion 22 can be a rectangular shape or can be a trapezoidal shape or a shape including a curved portion. Further, the bottomed hole 51 can be provided so that the inner bottom surface 51B is located in a part of the wiring pattern of the metal member 20 without providing the connection pad portion 22.

Figure 2C:
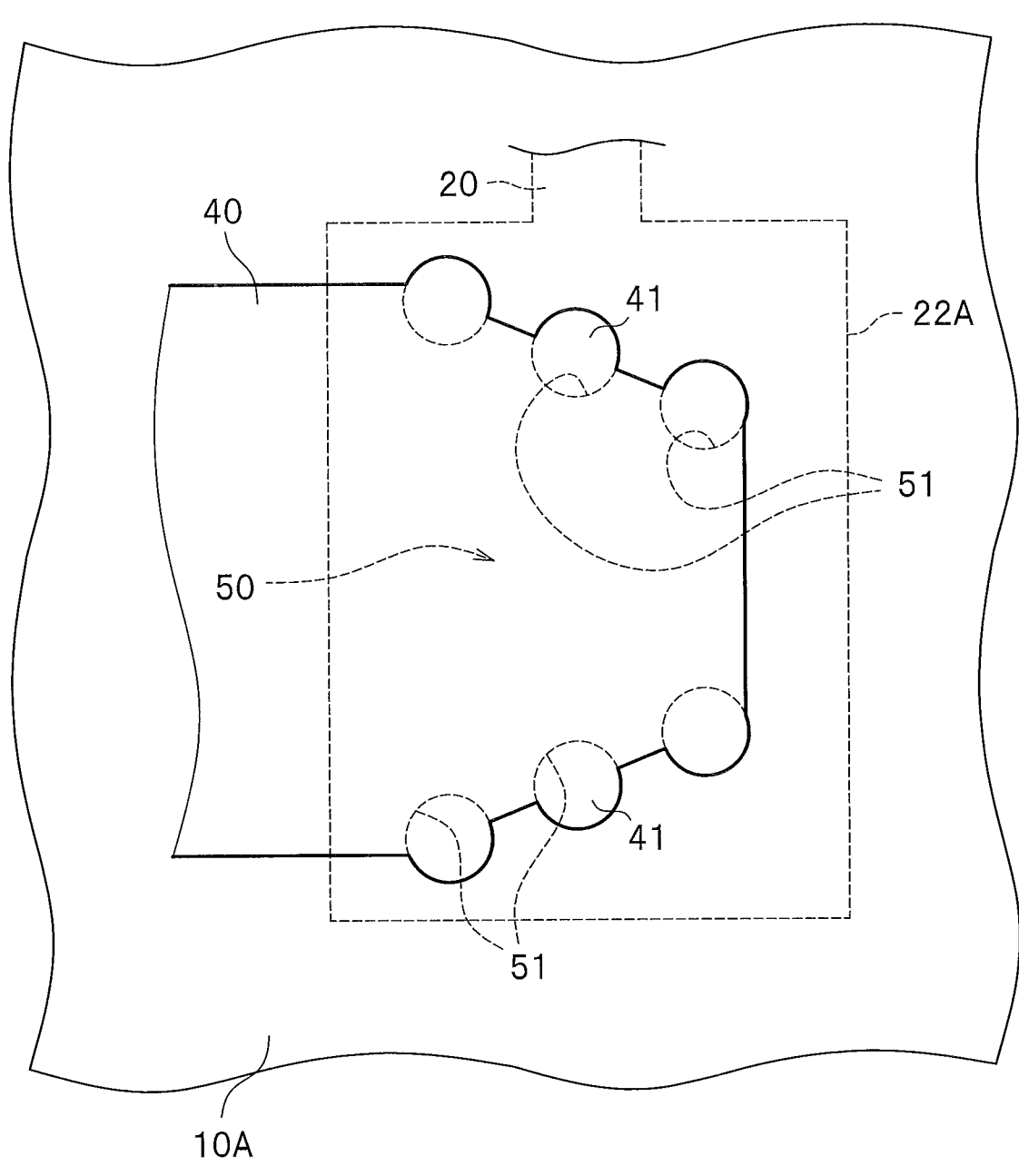
FIG. 2C is a schematic plan view of the first surface side showing another example of the via connector according to the embodiment.
Figure 3:
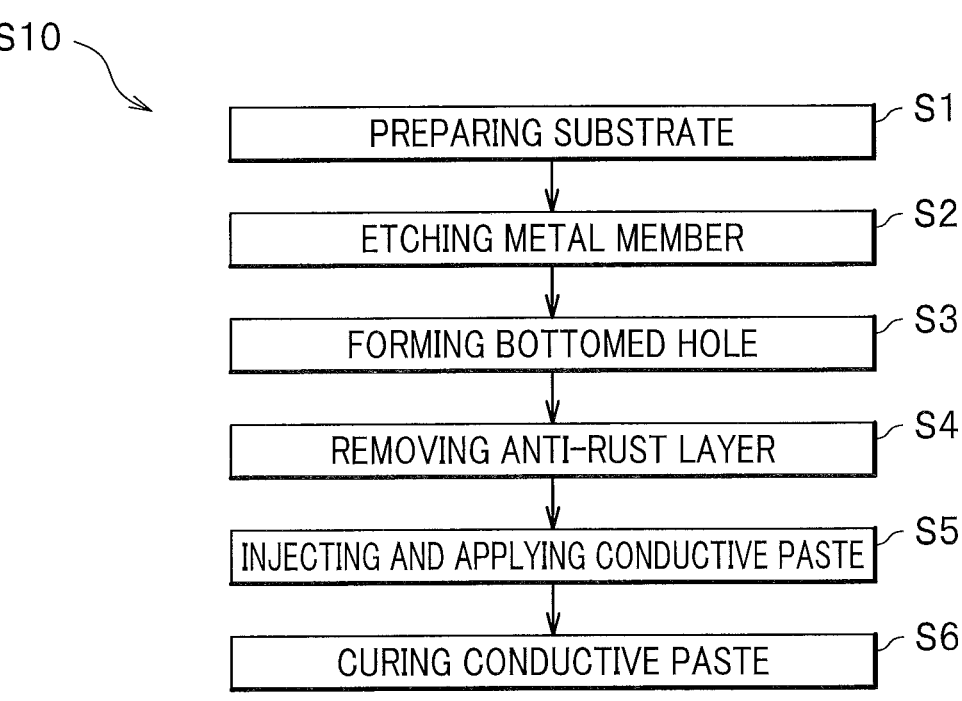
FIG. 3 is a flowchart showing a method for manufacturing a wiring board according to the embodiment.

Further, the number of the bottomed holes 51 provided for one connection pad portion 22 or the wiring pattern of the continuous metal member 20 can be one or three or more. If a plurality of bottomed holes are provided, the bottomed holes can be arranged in the same direction as the wiring of the conductive paste 40 as shown in FIG. 2A, or can be arranged in a direction different from the wiring of the conductive paste 40. For example, as shown in FIG. 2C, the wiring of the conductive paste 40 can be terminated at the position of a rectangular connection pad portion 22A so that three bottomed holes 51 are lined up in different directions.

Next, a method S10 for manufacturing a wiring board according to the embodiment will be described with reference to FIGS. 3 to 5A. The method S10 for manufacturing a wiring board includes: a step S1 of preparing the substrate 30 including the insulating resin 10 having the first surface 10A and the second surface 10B on the side opposite to the first surface 10A and the metal member 20 which is arranged so as to face the second surface 10B of the insulating resin 10 and has the anti-rust layer 21 formed on its surface; a step S3 of forming the bottomed hole 51 by irradiating a first laser beam L1 from the first surface 10A side of the insulating resin 10, the bottomed hole 51 penetrating the insulating resin 10 and having the inner bottom surface 51B that is the surface of the metal member 20 on the insulating resin 10 side; a step S4 of removing the anti-rust layer 21 formed on the surface of the metal member 20 in the inner bottom surface 51B of the bottomed hole 51; a step S5 of injecting the conductive paste 40 into the bottomed hole 51 and applying the conductive paste 40 to the first surface 10A of the insulating resin 10 so as to have a wiring continuous with the injected conductive paste 40; and a step S6 of curing the conductive paste.

(Preparing Substrate)

The step S1 of preparing a substrate is a step of preparing the substrate 30 having the metal member 20 arranged so as to face one surface (the second surface 10B) of the insulating resin 10. The metal member 20 is, for example, a copper foil, and has the anti-rust layer 21 formed on its surface on the insulating resin 10 side.

The metal member 20 is bonded to the polyimide layer 11 that is the base material of the insulating resin 10 via the resin layer 12 to be an adhesive layer. The metal member 20 and the insulating resin 10 are prepared by being bonded to each other in the form of a sheet. The material, structure, and thickness of the insulating resin 10 are not particularly limited. For example, the metal member 20 and the polyimide layer 11 can be bonded to each other by thermocompression bonding or the like without providing the resin layer 12. The substrate 30 can be prepared by purchasing. Alternatively, it is also possible to use a material in which the polyimide layer 11 and the resin layer 12 are formed of a polyimide resin and integrated with the insulating resin 10.

(Etching Metal Member)

The step S2 of etching the metal member is a step of forming a wiring pattern on the metal member 20 by etching. The formation of the wiring pattern also includes the formation of the connection pad portion 22. In the step S1 of preparing a substrate, a substrate having the wiring pattern of the metal member 20 already formed thereon can be purchased. In that case, the step S2 of etching the metal member can be omitted.

(Forming Bottomed Hole)

The step S3 of forming a bottomed hole is a step of forming the bottomed hole 51 in the insulating resin 10 so as to penetrate the insulating resin 10. If the bottomed hole 51 is small, it is difficult to inject the conductive paste 40 in a subsequent step. On the other hand, if the bottomed hole 51 is large, it becomes necessary to form a large metal member 20, which limits the arrangement of the wiring pattern of the metal member 20. Therefore, the bottomed hole 51 has a maximum diameter D1 of 50 μm to 800 μm, preferably 100 μm to 500 μm, and more preferably 200 μm to 300 μm.

In the step S3 of forming a bottomed hole, the bottomed hole 51 is formed so that the inner diameter of the bottomed hole 51 is increased from the second surface 10B side to the first surface 10A side. That is, the bottomed hole 51 has a tapered shape that tapers toward the inner bottom surface 51B.

In the step S3 of forming the bottomed hole, the bottomed hole 51 is formed in the insulating resin 10 made of a resin by irradiating the first laser beam L1 from the first surface 10A side. The laser to be used is preferably a $CO_2$ laser from the viewpoint of processing speed, but a green laser, a UV laser or the like can also be used.

Further, in the step S3 of forming the bottomed hole, a plurality of bottomed holes 51 having the inner bottom surface 51B as the surface of the continuous metal member 20 on the insulating resin 10 side are formed in parallel. Then, in the step S5 of injecting and applying a conductive paste to be described later, the conductive paste 40 in contact with the inner bottom surface 51B of the plurality of bottomed holes 51 formed in parallel is made continuous through the conductive paste 40 on the first surface 10A.

In this step S3, as an example, two bottomed holes 51 are formed in parallel at positions facing one connection pad portion 22 formed of the continuous metal member 20. The connection pad portion 22 has its surface on the insulating resin 10 side that serves as the inner bottom surfaces 51B of the two bottomed holes 51. Then, in the step S5 of injecting and applying the conductive paste, the conductive paste 40 is injected and applied so that the conductive paste 40 in contact with the inner bottom surfaces 51B of the two bottomed holes 51 is continuous through the conductive paste 40 on the first surface 10A. The bottomed hole 51 can be formed in a position facing the metal member 20 regardless of whether or not it is the connection pad portion 22.

(Removing Anti-Rust Layer)

The step S4 of removing the anti-rust layer is a step of removing the anti-rust layer 21 on the inner bottom surface 51B of the bottomed hole 51. In this step S4, the central portion of the inner bottom surface 51B of the bottomed hole 51 is irradiated with a second laser beam L2 having a larger energy than the first laser beam L1. By the irradiation of the second laser beam L2, a region 52 where the anti-rust layer 21 is removed is formed on the inner bottom surface 51B. In order to remove the anti-rust layer 21, the second laser beam L2 having a larger energy than the first laser beam L1 suitable for processing the resin is required. A temperature rise due to the irradiation of the second laser beam L2 can melt and deform the insulating resin 10 around the inner bottom surface 51B. Therefore, it is preferable that the second laser beam L2 is irradiated in the central portion of the inner bottom surface 51B away from an inner side surface 51A.

It is also preferable that the first and second laser beams L1 and L2 are irradiated using the same laser. By using the same laser, it is possible to improve alignment accuracy for adjusting the irradiation position on the inner bottom surface 51B of the bottomed hole 51. In addition, since device replacement is no longer necessary, the productivity in the manufacturing process can be improved.

It is also preferable that the first and second laser beams L1 and L2 are irradiated by using a $CO_2$ laser. The $CO_2$ laser has a long wavelength of the laser light and thus has little influence on the metal member 20, making processing possible by irradiating with high-power irradiation of 200 W output or more, for example. Therefore, the insulating resin 10 and the anti-rust layer 21 can be efficiently removed.

The second laser beam L2 is irradiated through an opening of a mask ML, for example. The second laser beam L2 passing through the opening of the mask ML is focused by a lens and irradiated onto the central portion of the inner bottom surface 51B of the bottomed hole 51. The opening of the mask ML can have a circular shape, for example. On the inner bottom surface 51B, the area irradiated with the second laser beam L2 is preferably 20% to 60% of the area of the inner bottom surface 51B, and the maximum diameter of the region irradiated with the second laser beam L2 is, for example, 20 μm to 300 μm, preferably 50 μm to 200 μm.

(Injecting and Applying Conductive Paste)

The step S5 of injecting and applying a conductive paste is a step of applying the conductive paste 40 with fluidity before curing to the bottomed hole 51 and the first surface 10A of the insulating resin 10. As for the application, the conductive paste 40 can be injected, for example, from a nozzle of a dispenser or can be provided by screen printing, or nozzle injection and screen printing can be combined, such as performing screen printing after injection from the nozzle.

In the step S5 of injecting and applying the conductive paste, as an example, the conductive paste 40 is injected and applied through an opening MA1 of the mask M1. In a plan view, the area where the opening MA1 of the mask M1 overlaps with the opening of the bottomed hole 51 is 40% to 70% of the area of the opening of the bottomed hole 51, preferably 45% to 60%, more preferably 50% to 55%. The injection and application of the conductive paste 40 can be performed by screen printing or metal mask printing using the mask M1.

Figure 5A:
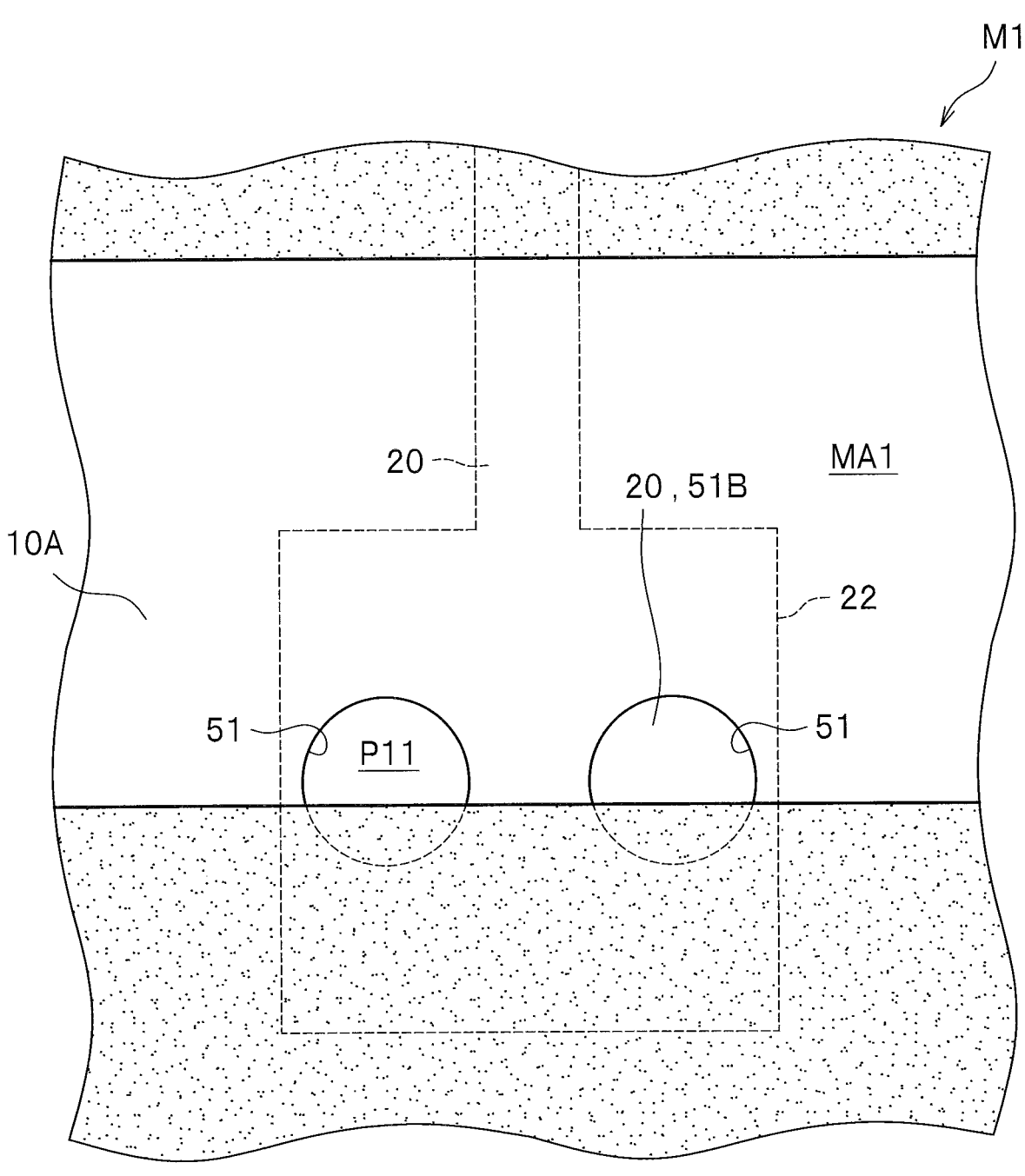
FIG. 5A is a schematic plan view showing a part of a mask used to dispose the conductive paste in the method for manufacturing a wiring board according to the embodiment.

As shown in FIG. 5A, the opening MA1 of the mask M1 overlaps with a part of the bottomed hole 51 in a plan view. Note that FIG. 5A is a schematic plan view of the substrate 30 as viewed from the first surface 10A side. As an example, the connection pad portion 22 of the metal member 20 is formed on the second surface 10B that is the opposite surface to serve as the inner bottom surface 51B of the bottomed hole 51. The conductive paste 40 is injected into the bottomed hole 51 from a region P11 where the opening MA1 overlaps with the bottomed hole 51. As an example, the opening of the bottomed hole 51 has a circular shape, and the region P11 has a shape such that a bow shape is removed from the opening of the bottomed hole 51. In this step S5, the position for injecting the conductive paste 40 into the bottomed hole 51 and the amount thereof can be adjusted by adjusting the shape and size of the region P11.

Figure 4A:
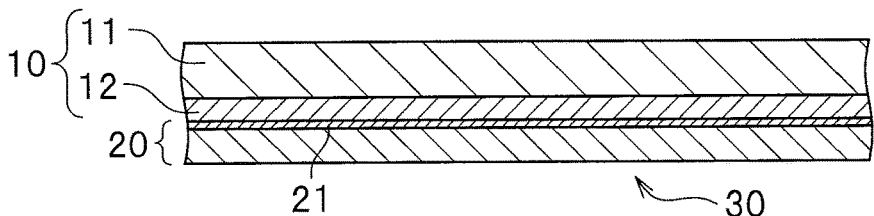
FIG. 4A is a schematic cross-sectional view showing a wiring board prepared in the method for manufacturing a wiring board according to the embodiment.
Figure 4B:
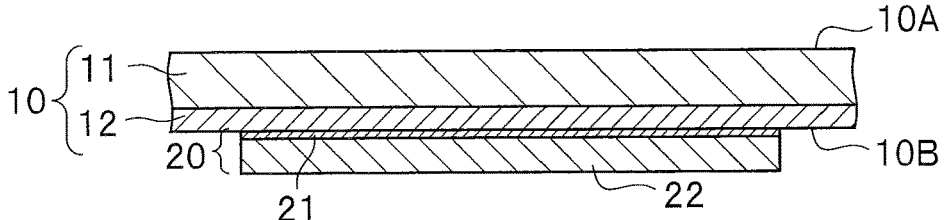
FIG. 4B is a schematic cross-sectional view showing a state where a wiring pattern of a metal member is formed in the method for manufacturing a wiring board according to the embodiment.
Figure 4C:
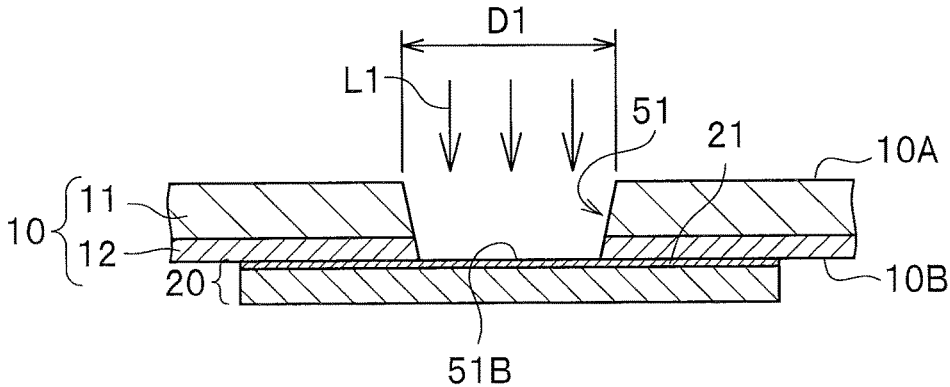
FIG. 4C is a schematic cross-sectional view showing a state where a bottomed hole is formed in the method for manufacturing a wiring board according to the embodiment.
Figure 4D:
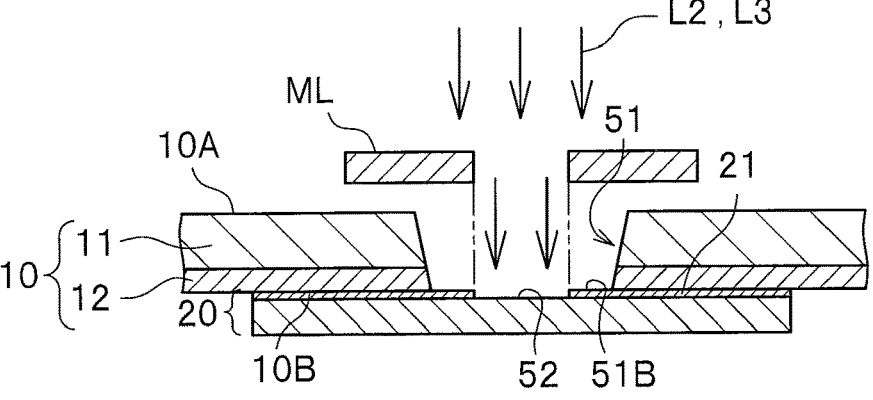
FIG. 4D is a schematic cross-sectional view showing a state where an anti-rust layer is partially removed in the method for manufacturing a wiring board according to the embodiment.
Figure 4E:
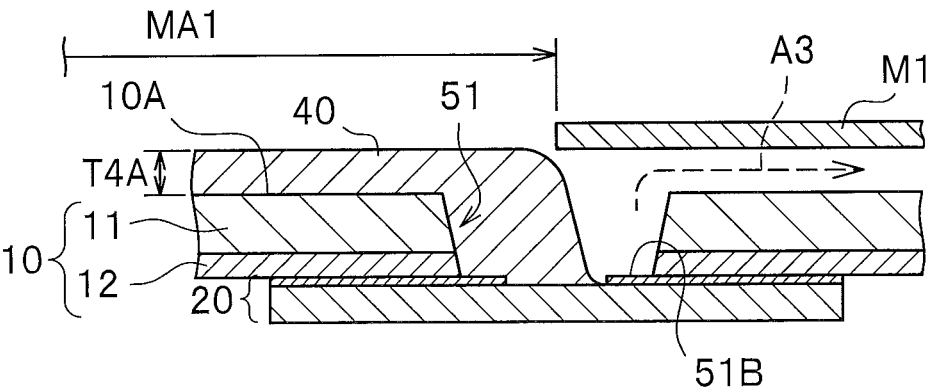
FIG. 4E is a schematic cross-sectional view showing a state where a conductive paste is applied in the method for manufacturing a wiring board according to the embodiment.
Figure 4F:
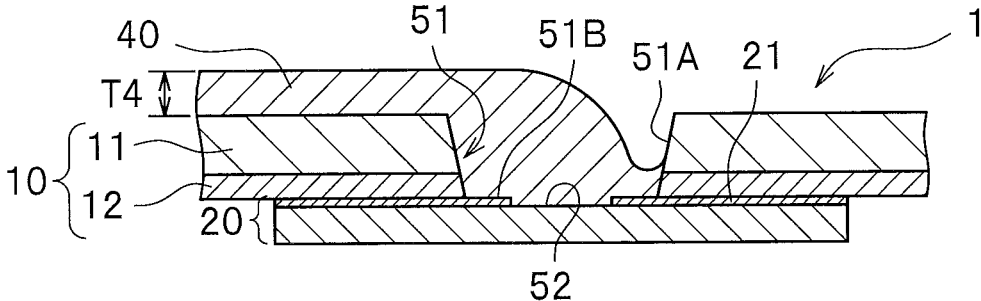
FIG. 4F is a schematic cross-sectional view showing a state where the conductive paste is cured in the method for manufacturing a wiring board according to the embodiment.

As shown in FIG. 4E, the inner bottom surface 51B immediately after injection has a portion that does not face the conductive paste 40. The conductive paste 40 spreads in close contact with the inner bottom surface 51B due to its fluidity. In this event, the air facing the inner bottom surface 51B is discharged to the outside from the bottomed hole 51 as an air flow A3, for example, so as to be pushed out by the conductive paste 40.

(Curing Conductive Paste)

The step S6 of curing the conductive paste is a step of curing the applied conductive paste 40. The conductive paste 40 is cured by heat treatment, for example.

The conductive paste 40 located inside the bottomed hole 51 faces the entire surface of the region 52 where the anti-rust layer 21 is removed. This reduces the electrical resistance at the connection between the metal member 20 and the conductive paste 40. Further, since the region 52 does not come into contact with air, oxidation of the metal member 20 can be suppressed.

The volume of the conductive paste 40 located inside the bottomed hole 51 is 80% or more, preferably 90% or more, and more preferably 100% of the volume of the bottomed hole 51. The wiring resistance of the conductive paste 40 inside the bottomed hole 51 can be reduced as the volume of the conductive paste 40 located inside the bottomed hole 51 approaches 100% of the volume of the bottomed hole 51.

The method S10 for manufacturing a wiring board including the above configuration includes the steps of: irradiating the first laser beam L1 from the first surface 10A side of the insulating resin 10; forming the bottomed hole 51 which penetrates the insulating resin 10 and has the surface of the metal member 20 on the insulating resin 10 side as the inner bottom surface 51B; and injecting the conductive paste 40 into the bottomed hole 51. Thus, the electrical connection between the metal member 20 and the conductive paste 40 can be ensured.

The method S10 for manufacturing a wiring board further includes the step of, in addition to injecting the conductive paste 40 into the bottomed hole 51, applying the conductive paste 40 onto the first surface 10A of the insulating resin 10 so as to have a wiring continuous with the injected conductive paste 40, and then curing the conductive paste. Thus, the conductive paste 40 can be printed and placed in one step, for example, on the first surface 10A of the insulating resin 10 and the bottomed hole 51. Therefore, wiring and via filling can be easily performed. Further, the conductive paste 40 has elasticity and thus is unlikely to break against bending or warping of the wiring board 1. Therefore, reliable wiring can be achieved.

In the method S10 for manufacturing a wiring board, the area where the opening MA1 of the mask M1 overlaps with the opening of the bottomed hole 51 is 45% to 60% of the area of the opening of the bottomed hole 51 in a plan view. Therefore, the inner bottom surface 51B immediately after the conductive paste 40 is injected through the opening MA1 of the mask M1 has a portion not facing the conductive paste 40. The conductive paste 40 then spreads to the inner bottom surface 51B while pushing out air. Thus, the adhesion between the inner bottom surface 51B and the conductive paste 40 can be improved while suppressing the generation of air bubbles.

According to the method S10 for manufacturing a wiring board, an increase in the resistance value due to the anti-rust layer 21 can be suppressed by removing the anti-rust layer 21 formed on the surface of the metal member 20 in the inner bottom surface 51B of the bottomed hole 51. When the metal member 20 that does not originally have the anti-rust layer 21 formed thereon is used, the temperature of the metal member 20 rises due to the irradiation of the first laser beam L1 or the like in the step S3 of forming the bottomed hole, resulting in a possibility that oxidation may progress and the electrical resistance at the connection may increase. In the method S10 of manufacturing a wiring board, the metal member 20 having the anti-rust layer 21 formed thereon is used, and the anti-rust layer 21 is removed before connecting to the conductive paste 40. Thus, the electrical resistance at the connection can be surely reduced. The metal member 20 having no anti-rust layer 21 formed thereon is, for example, a copper foil provided with only an organic film for anti-rust treatment and not provided with any roughened layer or plated layer.

In the method S10 for manufacturing a wiring board, the tapered bottomed hole 51 is formed so that the inner diameter of the bottomed hole 51 increases from the second surface 10B side toward the first surface 10A side. Thus, the conductive paste 40 can be injected while being in close contact with the inner side surface 51A of the bottomed hole 51, and the generation of air bubbles can be suppressed. Further, the angle formed by the first surface 10A of the insulating resin 10 and the inner side surface 51A of the bottomed hole 51 becomes an obtuse angle, making it less likely for the conductive paste 40 to break.

In the method S10 for manufacturing a wiring board, only the central portion of the inner bottom surface 51B of the bottomed hole 51 is irradiated with the second laser beam L2 having a higher energy than the first laser beam L1. Thus, the anti-rust layer 21 can be removed while suppressing the melting of the insulating resin 10 around the inner bottom surface 51B.

(Modified Example of Removing Anti-Rust Layer)

The removal of the anti-rust layer 21 can be performed, in the step S4 of removing the anti-rust layer, by irradiating the central portion of the inner bottom surface 51B of the bottomed hole 51 with a third laser beam L3 having a wavelength shorter than that of the first laser beam L1. The irradiation of the third laser beam L3 can be performed in the same manner as that of the second laser beam L2 described above. The short wavelength of the third laser beam L3 can facilitate the removal of the anti-rust layer 21. On the other hand, the laser beam having a short wavelength can damage the metal member 20. In such a case, the influence on the metal member 20 can be suppressed by shortening the irradiation time or suppressing the output power, for example.

The anti-rust layer 21 can be removed by grinding the surface of the inner bottom surface 51B of the bottomed hole 51 with a needle-shaped tool. When grinding with a tool, the ratio of the area of the region 52 where the anti-rust layer 21 is removed to the inner bottom surface 51B can be increased as compared with the case of irradiating with a laser beam. Further, in grinding with a tool, the region 52 can be formed in a position other than the central portion of the inner bottom surface 51B, and can be formed on the entire inner bottom surface 51B, for example.

The removal of the anti-rust layer 21 can be carried out by adding a reducing agent to the conductive paste 40 in the step S5 of injecting and applying the conductive paste. By adding the reducing agent to the conductive paste 40, laser beam irradiation and grinding with a tool for removing the anti-rust layer 21 can be omitted, making it possible to reduce the number of steps. The anti-rust layer 21 can be removed by any one of laser beam irradiation, grinding with a tool, and addition of the reducing agent to the conductive paste, or a combination of two or more.

(Modified Example of Mask for Applying Conductive Paste)

In the step S5 of injecting and applying the conductive paste 40, the amount of the conductive paste 40 injected into the bottomed hole 51 can vary depending on the direction in which a squeegee (spatula) is moved in screen printing with respect to the region P11. In such a case, improvement can be achieved by changing the shape of the region P11.

Figure 5B:
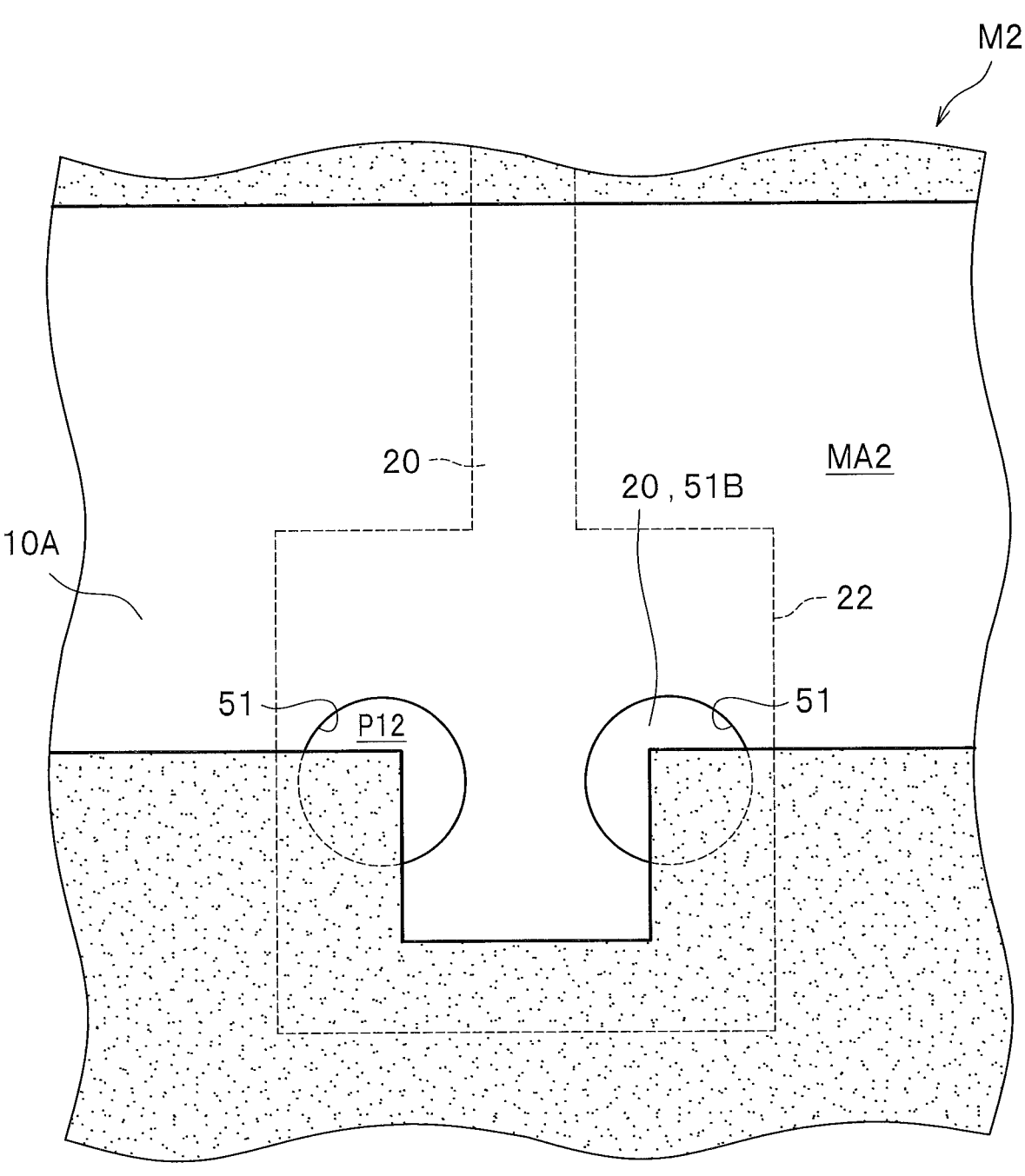
FIG. 5B is a schematic plan view showing a part of a modified example of the mask used to dispose the conductive paste in the method for manufacturing a wiring board according to the embodiment.

As shown in FIG. 5B, in a mask M2, a region P12 where an opening MA2 overlaps with the bottomed hole 51 has a substantially L shape. Using the mask M2 with the substantially L-shaped region P12 makes it possible to inject the conductive paste 40 into the bottomed hole 51 from two directions forming a substantially right angle. Thus, the conductive paste 40 can be injected into the bottomed hole 51 while reducing the variation in the amount.

Figure 5C:
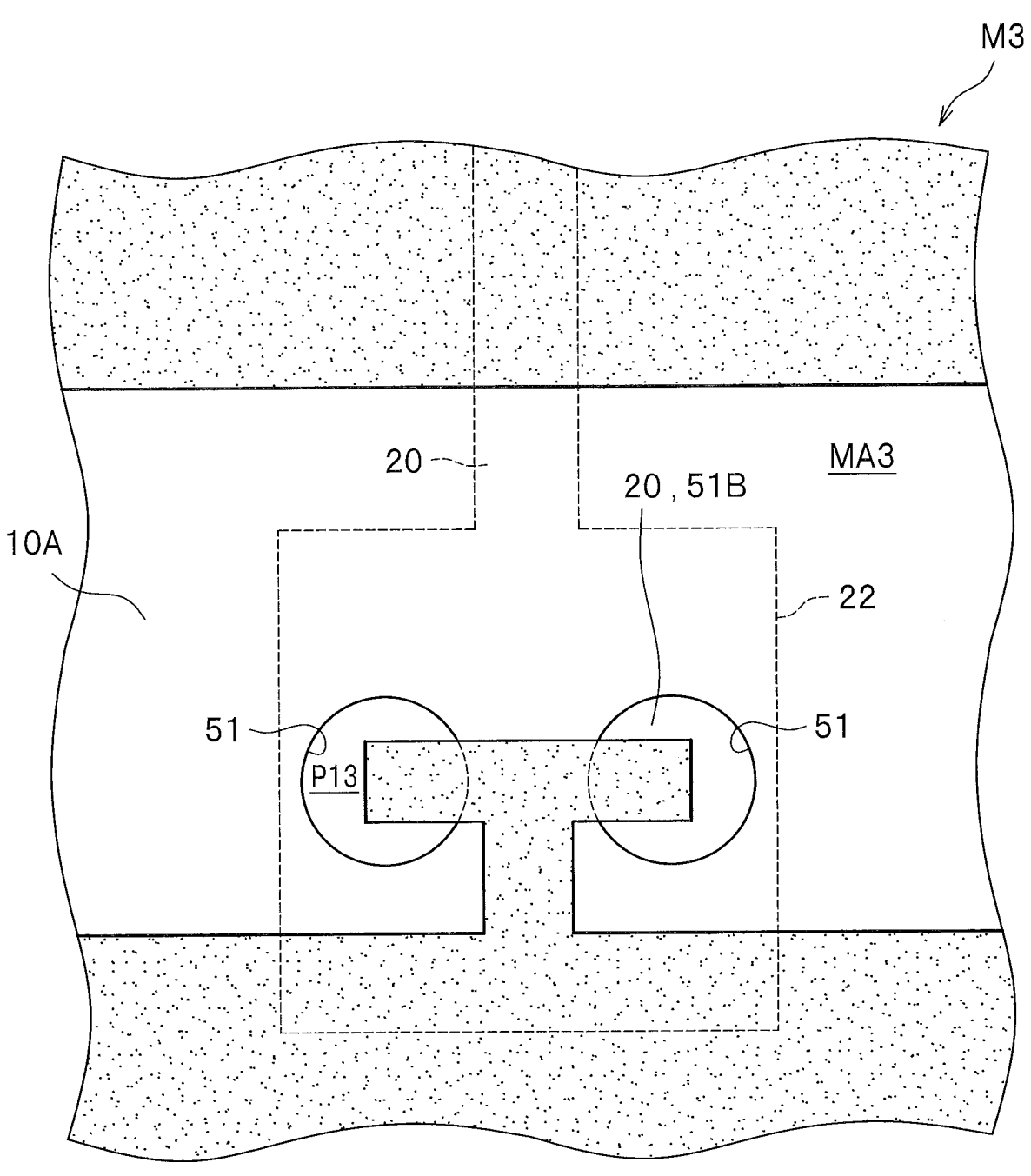
FIG. 5C is a schematic plan view showing a part of another modified example of the mask used to dispose the conductive paste in the method for manufacturing a wiring board according to the embodiment.

As shown in FIG. 5C, in a mask M3, a region P13 where an opening MA3 overlaps with the bottomed hole 51 in each region facing the connection pad portion 22 has two substantially C shapes in FIG. 5C, and the C-shaped openings are formed so as to face each other. Using the mask M3 with the substantially C-shaped region P13 makes it possible to inject the conductive paste 40 into the bottomed hole 51 from three directions. Thus, the conductive paste 40 can be injected into the bottomed hole 51 while further reducing the variation in the amount.

Figure 5D:
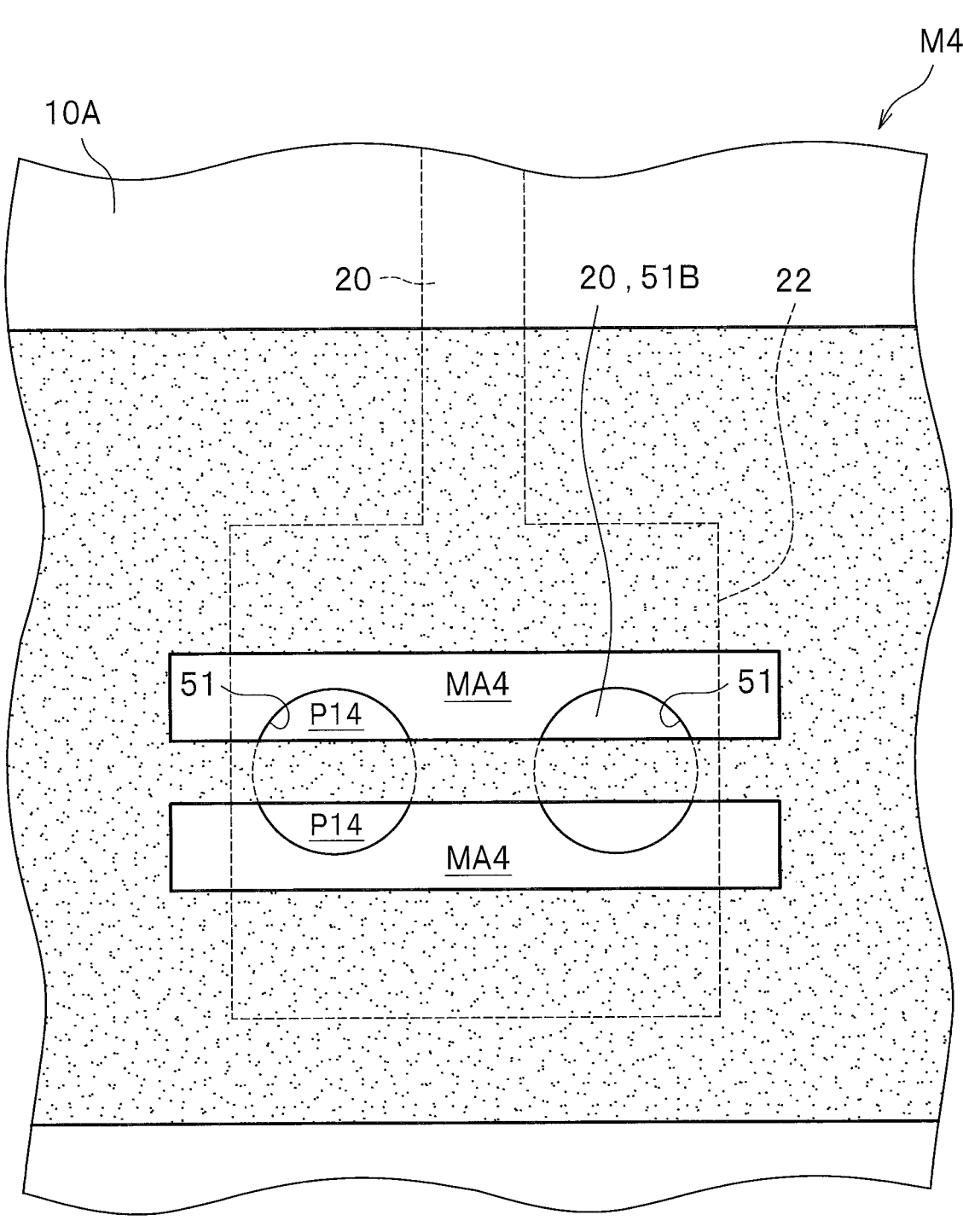
FIG. 5D is a schematic plan view showing a part of another modified example of the mask used to dispose the conductive paste in the method for manufacturing a wiring board according to the embodiment.

As shown in FIG. 5D, in a mask M4, a region P14 where an opening MA4 overlaps with the bottomed hole 51 is divided into two substantially parallel regions in one bottomed hole 51. Using the mask M4 with the two divided substantially parallel regions P14 makes it possible to inject the conductive paste 40 into the bottomed hole 51 from two opposite directions. Thus, the conductive paste 40 can be injected more evenly into the bottomed hole 51 while reducing the variation in the amount. Further, the mask M4 can finely adjust the amount of the conductive paste 40 injected into the bottomed hole 51 by adjusting the space between the substantially parallel regions P14.

[Planar Light Emitting Device]

Figure 6A:
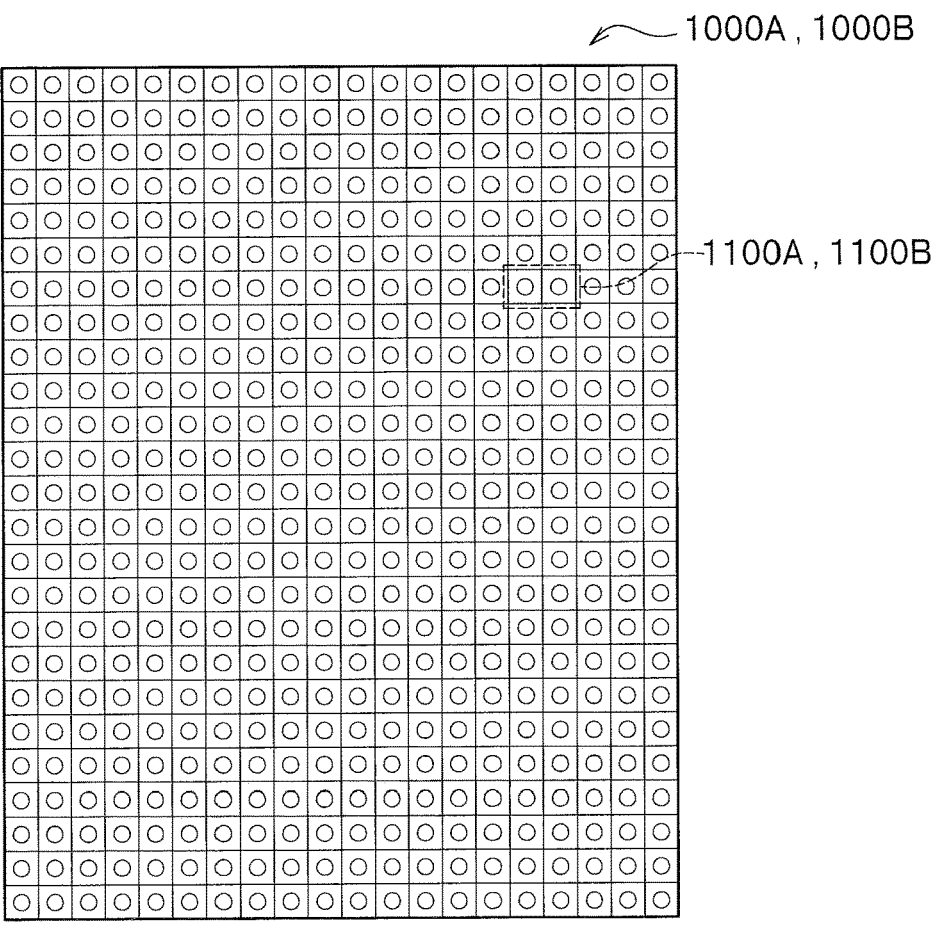
FIG. 6A is a schematic plan view showing a planar light emitting device according to first and second embodiments.
Figure 6B:
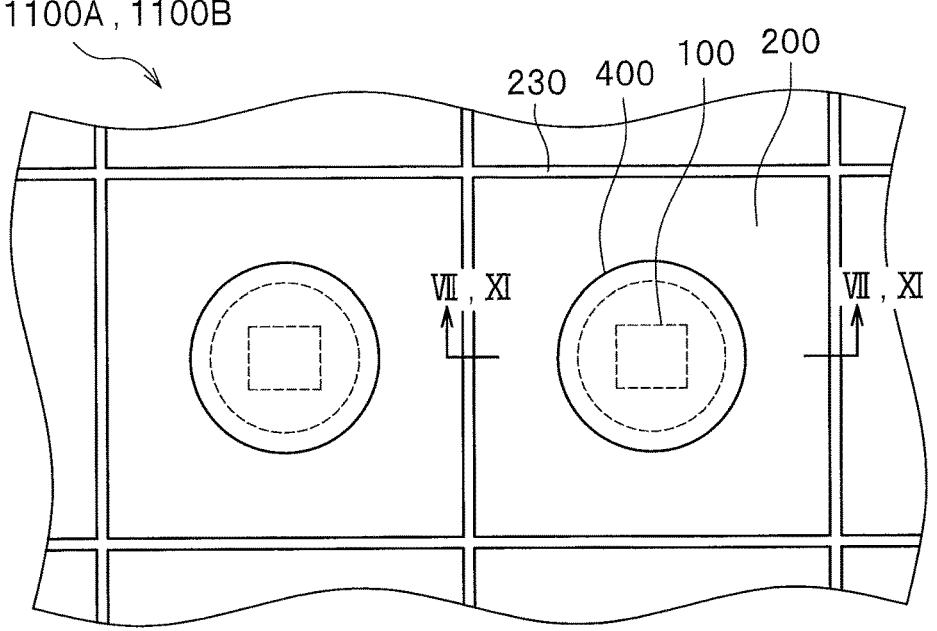
FIG. 6B is a schematic plan view showing a section of FIG. 6A on an enlarged scale.
Figure 6C:
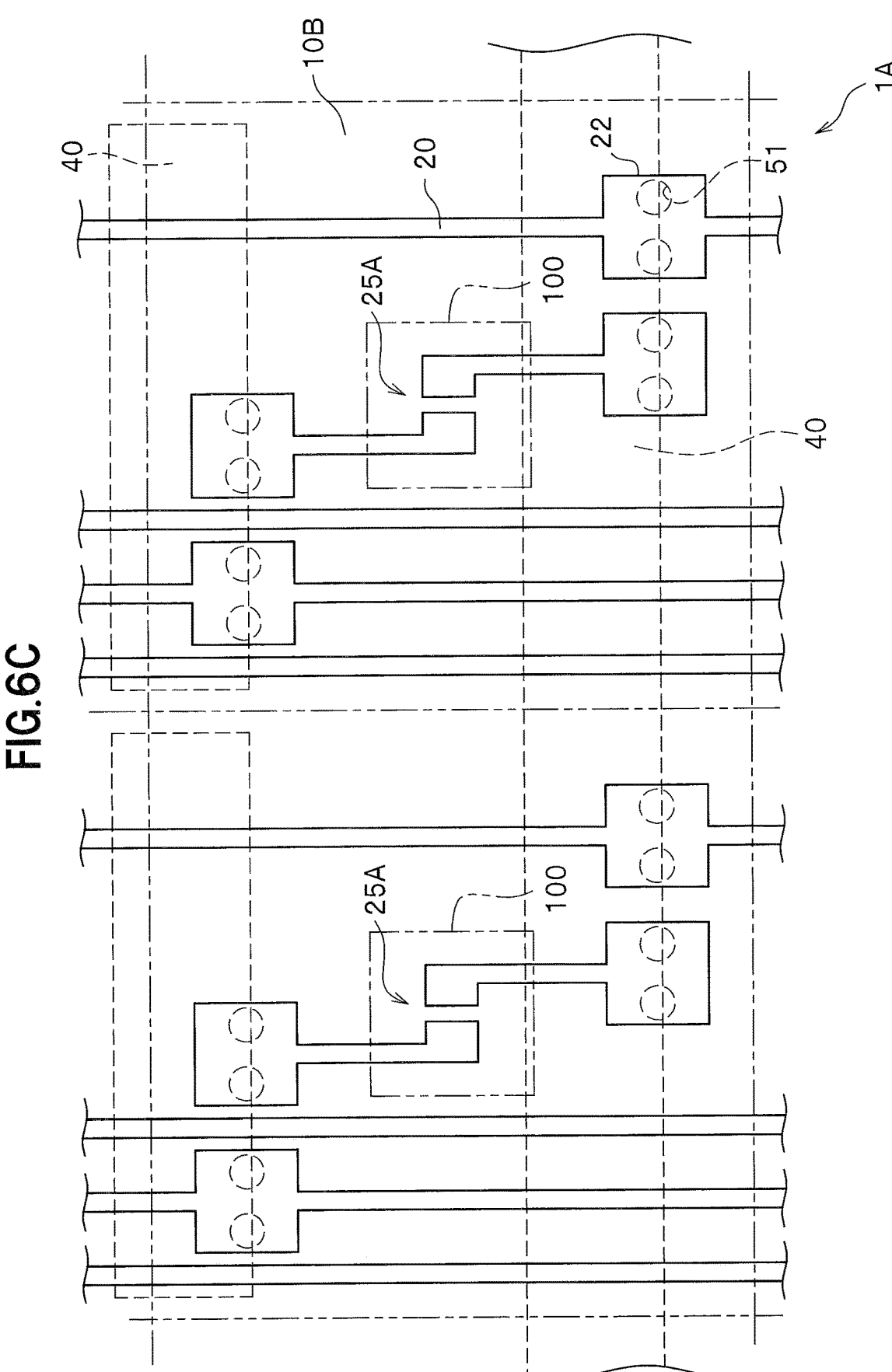
FIG. 6C is a schematic plan view showing a part of a wiring board in the planar light emitting device according to the first embodiment.
Figure 7:
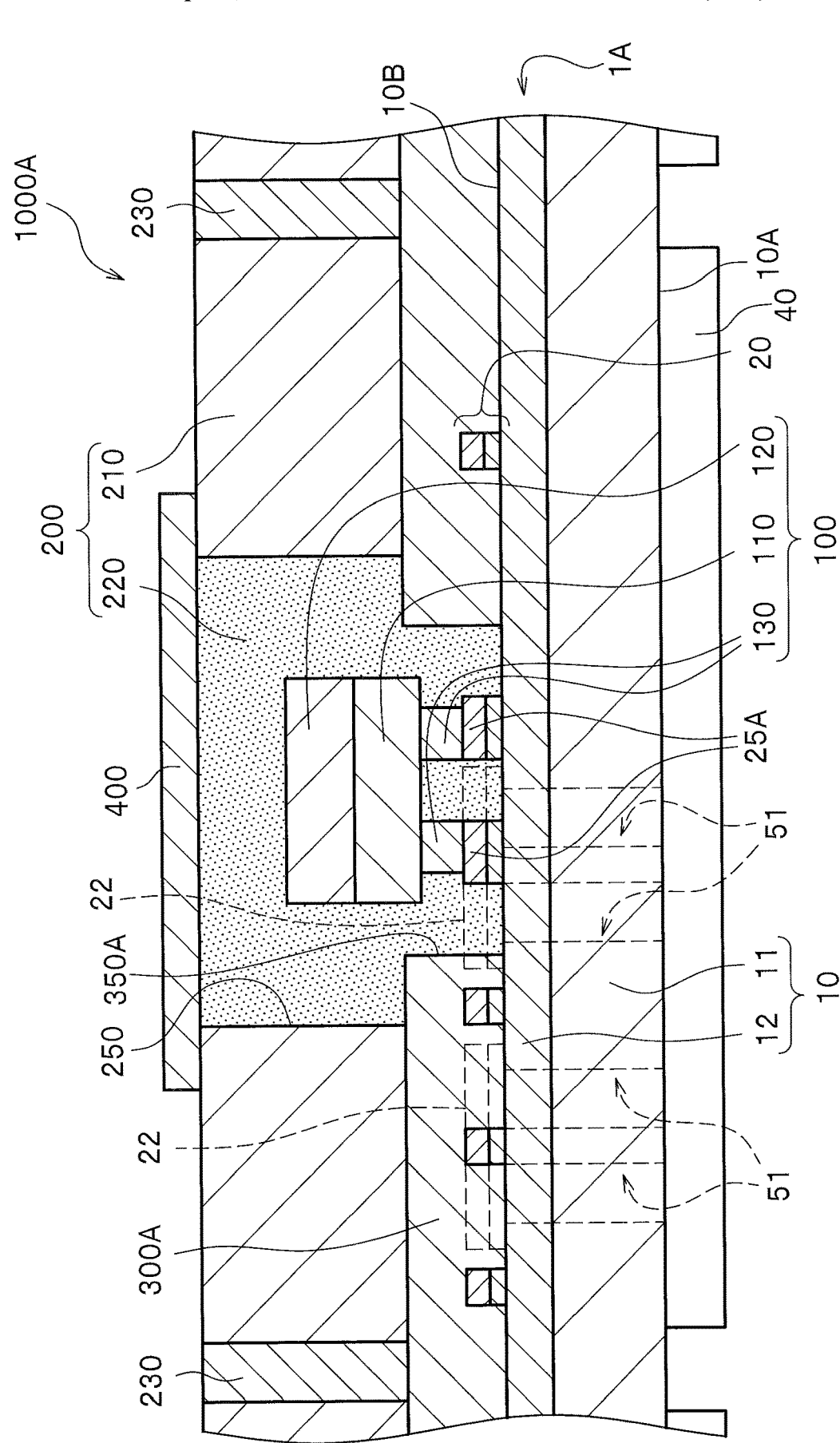
FIG. 7 is a schematic cross-sectional view taken along the line VII-VII in FIG. 6B, showing the planar light emitting device according to the first embodiment.

Next, a planar light emitting device 1000A according to a first embodiment will be described with reference to FIGS. 6A to 7. As shown in FIGS. 6A and 6B, the planar light emitting device 1000A is a device in which light sources 100 are arranged to emit planar light, and the brightness and turning on and off of each light source 100 can be independently controlled. In the planar light emitting device 1000A, each of the light sources 100 is separated by a reflection layer 230 to be described later, and one light source 100 is a cell which is a control unit for brightness and turning on and off. FIG. 6A is a schematic plan view of the entire planar light emitting device 1000A, and FIG. 6B is a schematic plan view showing a part 1100A of the planar light emitting device 1000A shown in FIG. 6A on an enlarged scale. FIG. 6C is a schematic plan view showing an example of a wiring board 1A where the light source 100 is arranged on an electrode 25A of a metal member 20. FIG. 7 is a schematic cross-sectional view showing a part of the planar light emitting device 1000A. Note that FIG. 6A also serves as a schematic plan view of the entire planar light emitting device 1000B to be described later, and FIG. 6B also serves as a schematic plan view showing a part 1100B of the planar light emitting device 1000B shown in FIG. 6A on an enlarged scale.

The planar light emitting device 1000A includes: the wiring board 1 already described; a light source 100 including a light emitting element 110 arranged on an electrode 25A of a metal member 20 in the wiring board 1; a light reflection member 300 that covers the metal member 20; and a first light guide member 210 that covers the light reflection member 300.

As the wiring board 1, one having the configuration already described is used. In the wiring board 1, various patterns of wiring can be formed depending on the application. The wiring board 1 used for the planar light emitting device 1000A has an electrode on which the light source 100 is arranged and a wiring for control are formed for the planar light emitting device 1000A, and this will be described as the wiring board 1A.

(Light Source)

The light source 100 has a light emitting element 110 having a pair of element electrodes 130, and a translucent member 120 arranged on the light extraction surface side of the light emitting element 110.

The light emitting element 110 includes a semiconductor laminate, and in this embodiment, the translucent member 120 is arranged on the upper surface side of the semiconductor laminate and has a pair of element electrodes 130 on the lower surface side. As the semiconductor laminate, any composition can be used depending on a desired emission wavelength, and a nitride semiconductor ($In_xAl_yGa_{1-x-y}N$, $0 \leq X$, $0 \leq Y$, $X+Y \leq 1$) capable of emitting blue or green light, GaP, or GaAlAs or AlInGaP capable of emitting red light can be used, for example. Further, the size and shape of the light emitting element 110 can be appropriately selected according to the purpose of use.

The translucent member 120 is made of, for example, a translucent resin material, and an epoxy resin, a silicone resin, a resin obtained by mixing these, or the like can be used. The translucent member 120 can contain a phosphor. For example, by containing a phosphor that absorbs blue light from the light emitting element 110 and emits yellow light, white light can be emitted from the light source 100. Further, the translucent member 120 can contain a plurality of kinds of phosphors. For example, by containing a phosphor that absorbs blue light from the light emitting element 110 and emits green light and a phosphor that emits red light, white light can also be emitted from the light source 100.

Examples of such phosphors include, for example, an yttrium-aluminum-garnet-based phosphor (for example, $Y_3$ (Al, $Ga)_5O_{12}$:Ce), a lutetium-aluminum-garnet-based phosphor (for example, $Lu_3$(Al, $Ga)_5O_{12}$:Ce), a terbium-aluminum-garnet-based phosphor (for example, $Tb_3$(Al, $Ga)_5O_{12}$: Ce), a β-sialon phosphor (for example, (Si, $Al)_3$(O, $N)_4$:Eu), an α-sialon phosphor (for example, $Mz$(Si, $Al)_{12}$(O, $N)_{16}$ (where $0<z≤2$ and M is Li, Mg, Ca, Y, and lanthanide excluding La and Ce)), a nitride-based phosphor such as a CASN-based phosphor (for example, $CaAlSiN_3$:Eu) or an SCASN-based phosphor (for example, (Sr, Ca) $AlSiN_3$:Eu), a fluoride-based phosphor such as a KSF-based phosphor (for example, $K_2SiF_6$:Mn), a KSAF-based phosphor (for example, $K_2$(Si, $Al)F_6$:Mn), or an MGF-based phosphor (for example, $3.5 MgO._{0.5}MgF_2.GeO_2$:Mn), a quantum dot phosphor such as perovskite or chalcopyrite, and the like.

(Light Reflection Member)

A light reflection member 300A is a sheet-shaped member having light reflectivity. The light reflection member 300A is arranged on the second surface 10B of the insulating resin 10 in the wiring board 1A and covers the metal member 20. Here, the light reflection member 300A has an opening 350A surrounding the light source 100, and the opening 350A surrounds the periphery of the light source 100 at a distance of about 50 μm to 100 μm in a plan view. Therefore, the light reflection member 300A covers the metal member 20 except for a part located inside the opening 350A. The same goes for a method S100A for manufacturing a planar light emitting device according to the first embodiment to be described later.

In order to effectively utilize the light from the light source 100, it is preferable that the light reflection member 300A has a high reflectance and is white. The reflectance of the light reflection member 300A is preferably, for example, 90% or more, and more preferably 94% or more at the wavelength of the light emitted by the light source 100.

As the light reflection member 300A, a resin sheet containing large numbers of air bubbles (for example, a foamed resin sheet), a resin sheet containing a light diffusing material, or the like can be used. Examples of the resin used for the light reflection member 300A include a thermoplastic resin such as acrylic resin, polycarbonate resin, cyclic polyolefin resin, polyethylene terephthalate resin, polyethylene naphthalate resin or polyester resin, and a thermosetting resin such as epoxy resin or silicone resin. Further, as the light diffusing material, any heretofore known material can be used, such as titanium oxide, silica, alumina, zinc oxide or glass, for example.

(Light Guide Member)

A light guide member 200 includes a first light guide member 210 that covers the light reflection member 300A and a second light guide member 220 that covers the light source 100. The first light guide member 210 is a plate-shaped or sheet-shaped member having translucency. Here, the first light guide member 210 has an opening 250 surrounding the light source 100. The opening 250 surrounds the light source 100 at a distance of about 100 μm to 200 μm in a plan view, and has a size that contains the opening 350A inside at a position facing the opening 350A of the light reflection member 300A. Therefore, the first light guide member 210 covers the light reflection member 300A except for a part located inside the opening 250. The same goes for the method S100A for manufacturing a planar light emitting device according to the first embodiment to be described later and for first to third modified examples of the first light guide member. Further, the second light guide member 220 is filled in the opening 250 of the first light guide member 210 and is installed so as to cover from the opening 350A to the light source 100.

As the material of the first light guide member 210, for example, a thermoplastic resin such as acrylic, polycarbonate, cyclic polyolefin, polyethylene terephthalate or polyester, or a translucent material such as glass can be used. Particularly, it is preferable to use polycarbonate, which is highly transparent and inexpensive. The material of the second light guide member 220 is not limited as long as it is a transparent resin, but it is preferable to use a thermosetting resin such as epoxy resin, silicone resin, or acrylic resin.

The light guide member 200 is divided into cells by a reflection layer 230. The reflection layer 230 is provided to suppress light transmitted through the light guide member 200 from adjacent cells. The reflection layer 230 can be formed by adding a light diffusing material to a resin as the material of the light guide member 200. As the light diffusing material, titanium oxide, silica, alumina, and the like can be used, for example.

(Light Adjustment Member)

The planar light emitting device 1000A can include a light adjustment member 400. The light adjustment member 400 is a film-shaped or plate-shaped member that reflects some of the light from the light source 100 side to the light reflection member 300A side. The light adjustment member 400 is arranged in a position overlapping with the light source 100 on the surface of the light guide member 200 in a plan view.

The light adjustment member 400 has a transmittance of, for example, preferably 20% to 60%, more preferably 30% to 40% with respect to the light from the light source 100. As the material of the light adjustment member 400, for example, a resin material containing a light diffusing material can be used, or a metal material can be used. The resin material can be, for example, a silicone resin, an epoxy resin, or a resin obtained by mixing these. The light diffusing material can be, for example, a heretofore known material such as titanium oxide, silica, alumina, zinc oxide or glass. The light adjustment member 400 can have a size that includes the light source 100 at a position facing the light source 100 in a plan view, and is circular in FIG. 6B, but can be rectangular or the like.

In the planar light emitting device 1000A having the configuration as described above, the light source 100 including the light emitting element 110 is arranged on the electrode 25A of the metal member 20 in the wiring board 1A. The absorption of light by the metal member 20 can be suppressed by having the light reflection member 300A that covers the metal member 20, and the light from the light source 100 can be efficiently extracted by having the first light guide member 210 that covers the light reflection member 300A.

The planar light emitting device 1000A uses one light source 100 as one cell and as a control unit for brightness and turning on and off, but the number of light sources 100 included in one cell can be one or more than one. For example, four light sources 100 arranged in two rows and two columns or nine light sources 100 arranged in three rows and three columns can be used as one cell.

[Method for Manufacturing Planar Light Emitting Device]

Figure 8:
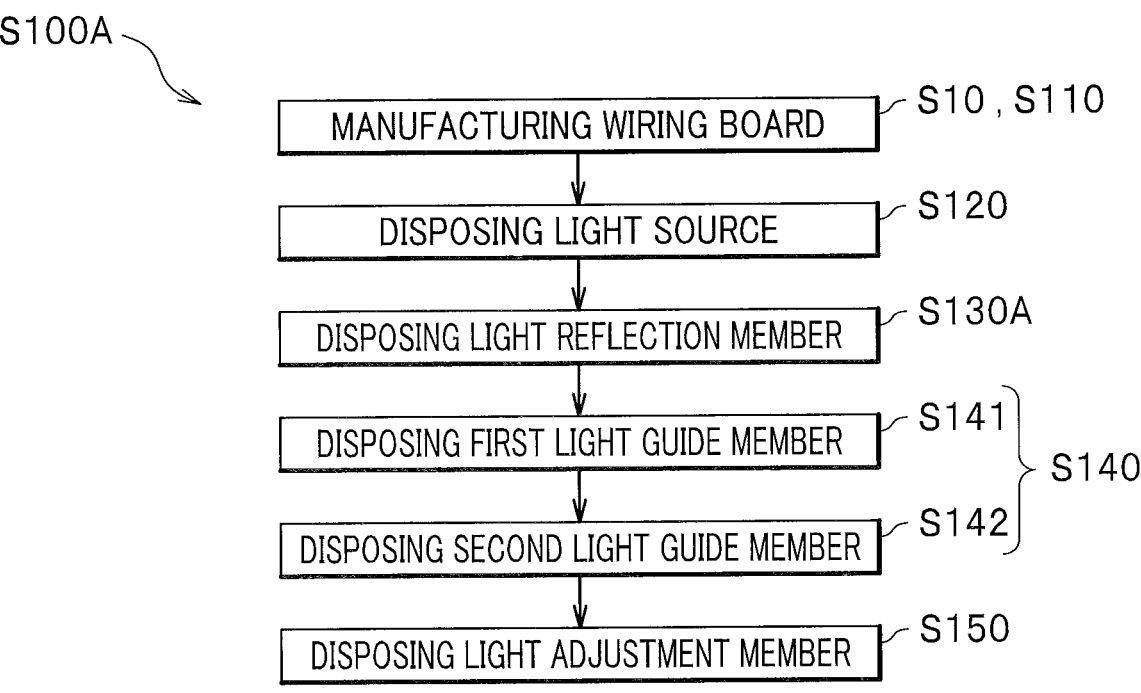
FIG. 8 is a flowchart showing a method for manufacturing a planar light emitting device according to the first embodiment.
Figure 9A:
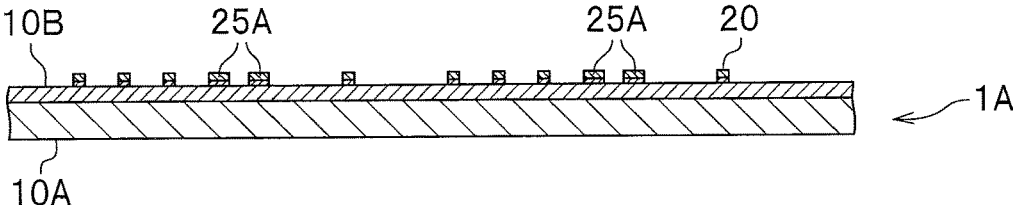
FIG. 9A is a schematic cross-sectional view showing a wiring board manufactured by the method for manufacturing a wiring board according to the embodiment in the method for manufacturing a planar light emitting device according to the first embodiment.
Figure 9B:
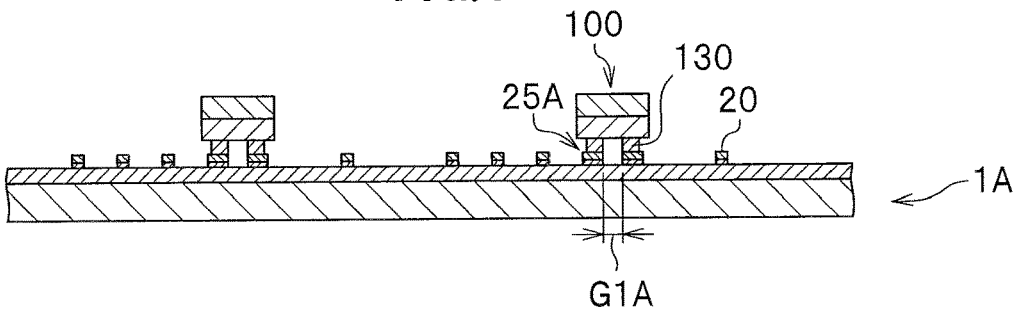
FIG. 9B is a schematic cross-sectional view showing a state where a light source is arranged in the method for manufacturing a planar light emitting device according to the first embodiment.
Figure 9C:
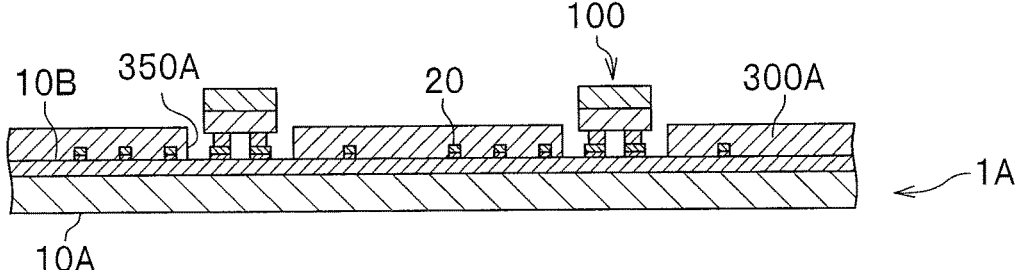
FIG. 9C is a schematic cross-sectional view showing a state where a light reflection member is arranged in the method for manufacturing a planar light emitting device according to the first embodiment.
Figure 9D:
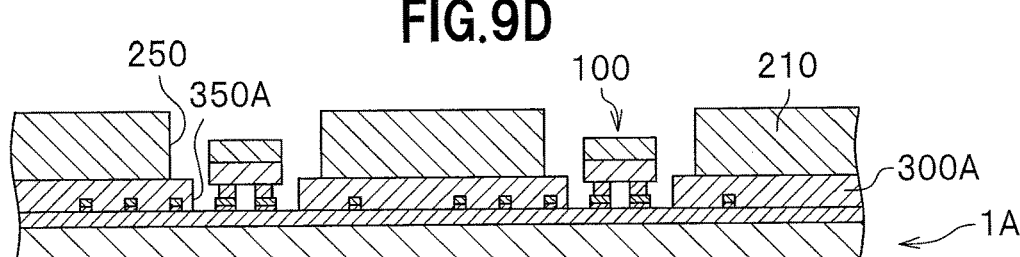
FIG. 9D is a schematic cross-sectional view showing a state where a first light guide member is arranged in the method for manufacturing a planar light emitting device according to the first embodiment.
Figure 9E:
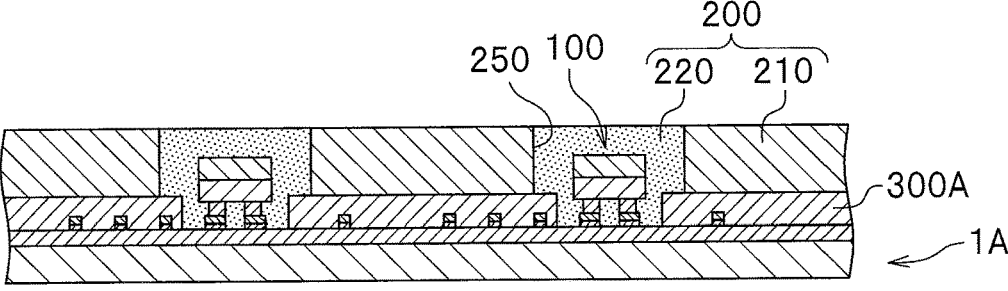
FIG. 9E is a schematic cross-sectional view showing a state where a second light guide member is arranged in the method for manufacturing a planar light emitting device according to the first embodiment.
Figure 9F:
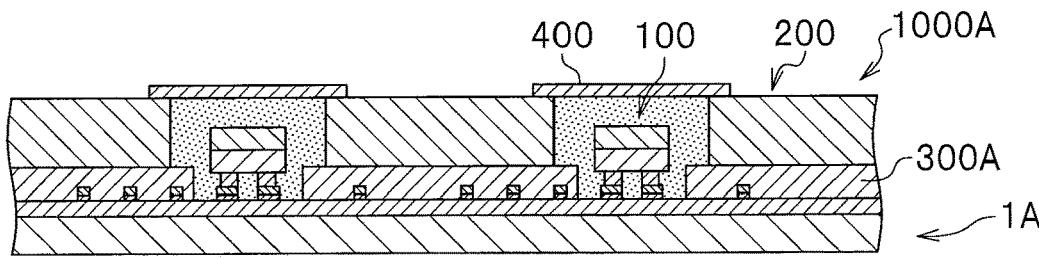
FIG. 9F is a schematic cross-sectional view showing a state where a light adjustment member is arranged in the method for manufacturing a planar light emitting device according to the first embodiment.

Next, the method S100A for manufacturing a planar light emitting device according to the first embodiment will be described with reference to FIGS. 8 to 9F. FIG. 8 is a flowchart of the method S100A for manufacturing a planar light emitting device. FIGS. 9A to 9F are schematic cross-sectional views schematically showing the method S100A for manufacturing a planar light emitting device.

The method S100A for manufacturing a planar light emitting device includes: a step S110 of manufacturing a wiring board according to the method S10 for manufacturing a wiring board; a step S120 of disposing a light source 100 including a light emitting element 110 on an electrode 25A of a metal member 20 in a wiring board 1A; a step S130A of disposing a light reflection member 300A so as to cover the metal member 20; and a step S141 of disposing a first light guide member 210 so as to cover the light reflection member 300A. The method can further include a step S142 of disposing a second light guide member 220 and a step S150 of disposing a light adjustment member 400.

(Manufacturing Wiring Board)

The step S110 of manufacturing a wiring board is a step of manufacturing a wiring board 1A by the method S10 for manufacturing a wiring board. In FIG. 9A, the second surface 10B side of the insulating resin 10 where the metal member 20 is disposed is the upper surface in the drawing. The distance between the electrodes 25A can be adjusted and formed according to the light source 100. Here, a distance G1A is set so that the electrodes 25A face the pair of element electrodes 130. The conductive paste 40 is arranged in the wiring board 1A, but is not shown in the cross section in FIGS. 9A to 9F.

(Disposing Light Source)

The step S120 of disposing a light source is a step of arranging the light source 100 on the wiring board 1A. In the method S100A for manufacturing a planar light emitting device, the light source 100 is arranged on the electrode 25A of the metal member 20 in the wiring board 1A. In this step S120, the pair of element electrodes 130 are bonded to the electrodes 25A via a conductive adhesive member. As the conductive adhesive member, bumps such as gold, silver and copper, a conductive paste which is a mixture of metal powder such as gold, silver, copper, platinum, and aluminum and a resin binder, or tin-silver-copper (SAC)-based or tin-bismuth (SnBi)-based solder can be used, for example. Here, the light source 100 is disposed by solder reflow. The conductive adhesive member is disposed between the pair of element electrodes 130 and the electrodes 25A.

(Disposing Light Reflection Member)

The step S130A of disposing the light reflection member is a step of arranging the light reflection member 300A so as to cover the metal member 20. In this step S130A, the light reflection member 300A has an opening 350A formed so as to surround the light source 100, and the light source 100 is arranged so as to be located at the opening 350A. An adhesive sheet having adhesive or sticky surfaces on both sides is attached to the upper and lower surfaces of the light reflection member 300A. The adhesive sheet is made of urethane, acrylic resin or the like, and has a thickness of about 10 μm to 75 μm. Further, it is desirable to add titanium oxide, barium sulfate or the like to the adhesive sheet to improve the reflectance. A white bonding sheet can be used as the adhesive or sticky sheet, and can be used in layers or sandwiched with a white polyethylene terephthalate sheet in order to further increase the reflectance. The light reflection member 300A can be arranged by applying an adhesive, instead of using the adhesive sheet.

(Disposing First Light Guide Member)

The step S141 of disposing a first light guide member is a step of arranging the first light guide member 210 so as to cover the light reflection member 300A. In this step S141, the first light guide member 210 is a plate-shaped or sheet-shaped member having an opening 250 formed therein so as to surround the light source 100, and the light source 100 is arranged so as to be located in the opening 250. In this step S141, the first light guide member 210 is aligned and then pressed toward the wiring board 1A while being heated, and is bonded to the light reflection member 300A. In this step S141, the first light guide member 210 has a reflection layer 230 formed in advance at a predetermined position (see FIG. 7).

(Disposing Second Light Guide Member)

The method S100A for manufacturing a planar light emitting device can include the step S142 of disposing a second light guide member. The step S142 of disposing a second light guide member is a step of arranging the second light guide member 220 so as to cover the light source 100. In this step S142, the second light guide member 220 can be arranged so as to cover the light source 100 by injecting a liquid or paste-like resin from the opening 250 of the first light guide member 210 and curing the resin. The material of the second light guide member 220 can be the same as or different from that of the first light guide member 210. In this step S142, the same material as the first light guide member 210 is injected from the opening 250 in an uncured state and then cured.

The step S140 of disposing the light guide member is the combination of the step S141 of disposing the first light guide member and the step S142 of disposing the second light guide member.

(Disposing Light Adjustment Member)

The method S100A for manufacturing a planar light emitting device can also include the step S150 of disposing a light adjustment member. The step S150 of disposing a light adjustment member is a step of arranging the light adjustment member 400 at a position overlapping with the light source 100 on the surface of the light guide member 200 in a plan view. In this step S150, the light adjustment member 400 can be formed by applying a resin as a material on the light guide member 200 and curing the resin, or by disposing a film-shaped or plate-shaped member. In this step S150, as an example, a silicone resin containing titanium oxide is applied in a position facing the light source 100 on the surface of the light guide member 200.

In the method S100A for manufacturing a planar light emitting device having the configuration as described above, the manufacturing time and the number of steps for manufacturing the wiring board are reduced by the method S10 for manufacturing a wiring board. Moreover, the light source 100 is arranged on the electrode 25A of the metal member 20, the light reflection member 300A is arranged so as to cover the metal member 20, and the first light guide member 210 is arranged so as to cover the light reflection member 300A. Thus, the manufacturing time and the number of steps for manufacturing the planar light emitting device can be further reduced.

(Modified Example of Light Guide Member)

Next, a modified example of the first light guide member will be described with reference to FIGS. 10A to 10C.

Figure 10A:
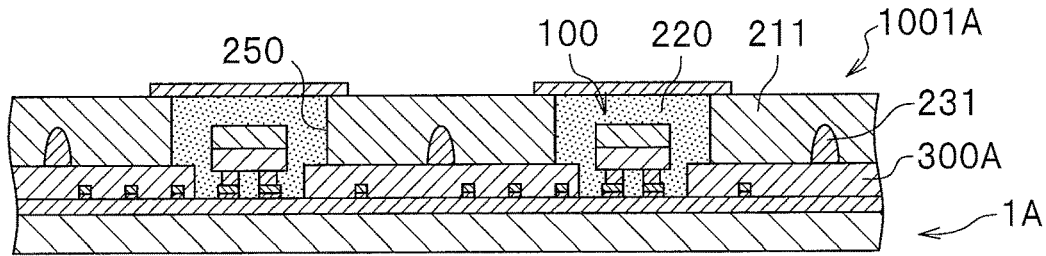
FIG. 10A is a schematic cross-sectional view showing a planar light emitting device according to a first modified example of the first light guide member.

In a planar light emitting device 1001A according to a first modified example of the first light guide member schematically shown in FIG. 10A, a reflection layer 231 has a semi-elliptical cross-sectional shape. It is preferable that the reflection layer 231 is provided so as to have the largest width in a position facing a light reflection member 300A and to become narrower toward the upper surface of a first light guide member 211 in the cross section. In this case, the reflection layer 231 is not provided in a position near the upper surface of the first light guide member 211.

The reflection layer 231 can be provided so as to have the largest width on the upper surface of the first light guide member 211 and to become narrower toward the lower surface in the cross section. In this case, the reflection layer 231 is not provided in a position near the lower surface of the first light guide member 211.

In the first modified example of the first light guide member, the reflection layer 231 that divides the first light guide member 211 between adjacent light sources 100 is not provided in a position close to the upper or lower surface of the first light guide member 211. This allows some of the light to spread beyond the range partitioned by the reflection layer 231. Thus, in the first modified example, a difference in brightness between the adjacent light sources 100 can be made inconspicuous. Further, in the first modified example, the brightness around the reflection layer 231 can be controlled by adjusting the width of the reflection layer 231 toward the upper or lower surface of the first light guide member 211.

Figure 10B:
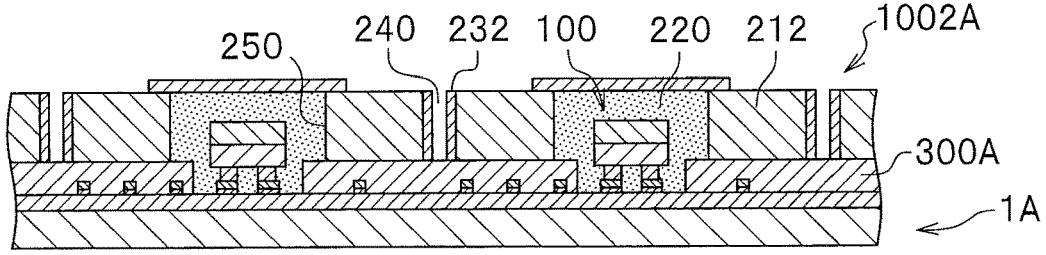
FIG. 10B is a schematic cross-sectional view showing a planar light emitting device according to a second modified example of the first light guide member.

In a planar light emitting device 1002A according to a second modified example of the first light guide member schematically shown in FIG. 10B, a reflection layer 232 has a rectangular cross-sectional shape, and is provided to have an equal width from the lower surface to the upper surface of a first light guide member 212. Further, the reflection layer 232 has a gap 240 from the adjacent first light guide member 212.

The first light guide member 212 having the reflection layer 232 can be formed, for example, by dividing the first light guide member without the reflection layer into individual pieces of the same size so that each includes one light source 100 and by applying a material of a reflection layer to the outer peripheral surface of the individual piece of the first light guide member.

In the second modified example of the first light guide member, the gap 240 is provided between the adjacent reflection layers 232, and thus two layers of the reflection layers 232 are provided between the adjacent light sources 100, making it possible to provide an air layer between the two layers. Therefore, according to the second modified example, the spread of light beyond the range partitioned by the reflection layers 232 can be further suppressed.

Figure 10C:
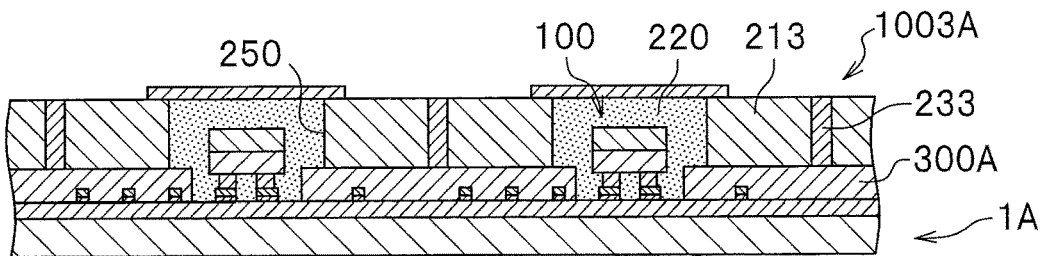
FIG. 10C is a schematic cross-sectional view showing a planar light emitting device according to a third modified example of the first light guide member.

In a planar light emitting device 1003A according to a third modified example of the first light guide member schematically shown in FIG. 10C, a reflection layer 233 has a rectangular cross-sectional shape, and is provided to have an equal width from the lower surface to the upper surface of a first light guide member 213.

The first light guide member 213 having the reflection layer 233 can be formed, for example, by dividing the first light guide member without the reflection layer into individual pieces of the same size so that each includes one light source 100, as in the case of the second modified example, and by fitting the individual piece of the first light guide member into the lattice of the reflection layer 233 which is formed in a lattice shape in advance.

In the third modified example of the first light guide member, by forming the first light guide member 213 and the reflection layer 233 separately, the first light guide member 213 and the reflection layer 233, which have surfaces thereof, can face each other. Thus, according to the third modified example, the reflectance on the boundary between the first light guide member 213 and the reflection layer 233 can be increased, the spread of light can be suppressed, and the light extraction efficiency can be improved.

In the first to third modified examples of the first light guide member, the opening 250 surrounding the light source 100 is formed in the same manner as the first light guide member 210. Further, the first to third modified examples can be similarly applied to the planar light emitting device according to a second embodiment.

Figure 11:
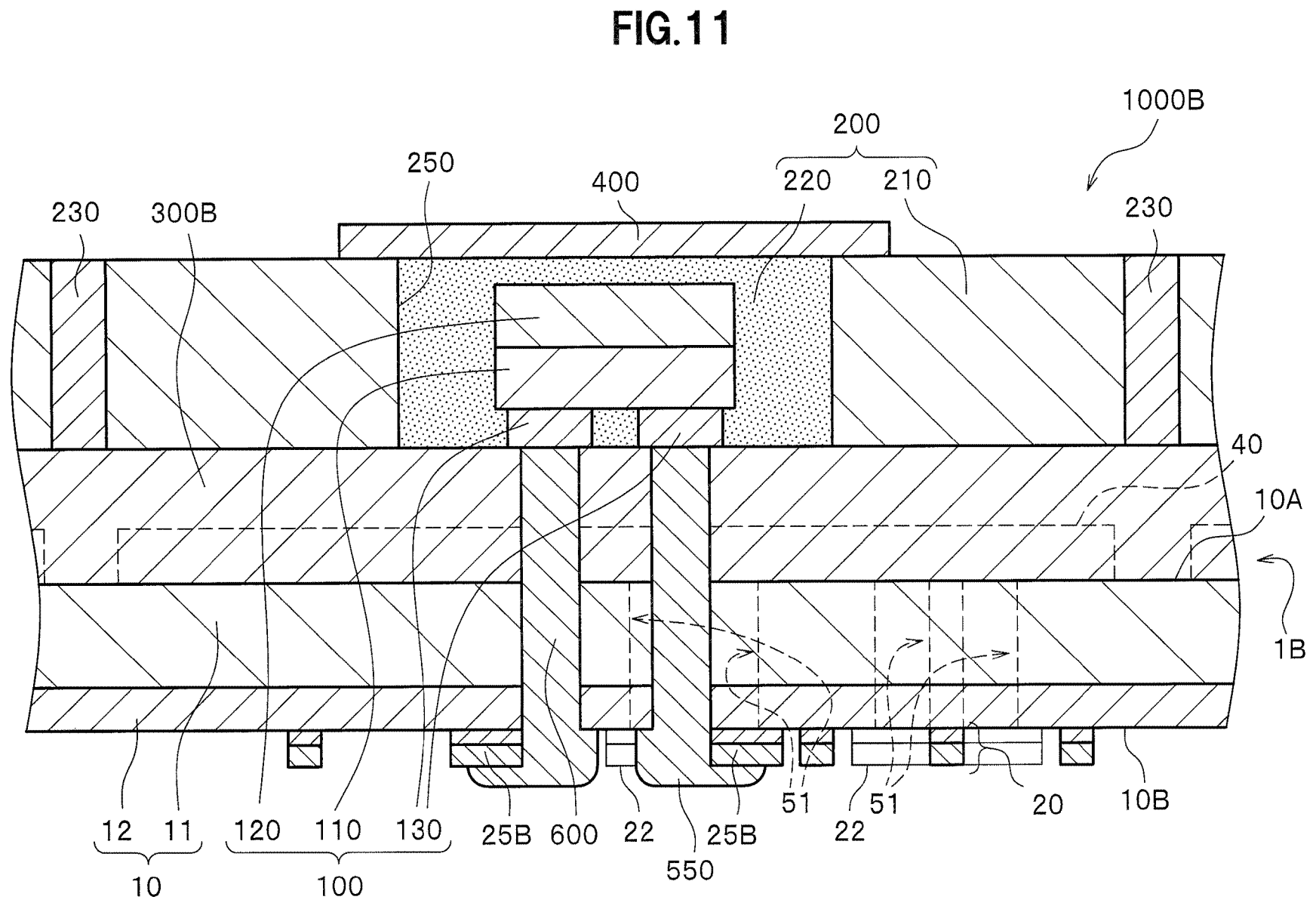

Next, a planar light emitting device 1000B according to the second embodiment will be described with reference to FIG. 11. FIG. 11 is a schematic cross-sectional view showing a part of the planar light emitting device 1000B. As in the case of the planar light emitting device 1000A described above, the planar light emitting device 1000B is a device in which light sources 100 are arranged on a wiring board 1 to emit planar light. In the planar light emitting device 1000B, a first surface 10A and a second surface 10B of the wiring board 1 are used upside down.

The planar light emitting device 1000B includes: a wiring board 1; a light reflection member 300B that covers a first surface 10A of an insulating resin 10 and a conductive paste 40 in the wiring board 1; a light source 100 that is arranged on the first surface 10A side of the insulating resin 10 and includes a light emitting element 110; a light guide member 200 that covers the light source 100 and the light reflection member 300B; and a light adjustment member 400 arranged in a position overlapping with the light source 100 on the surface of the light guide member 200 in a plan view.

Here, the wiring board 1 for the planar light emitting device 1000B is referred to as a wiring board 1B, and differences from the planar light emitting device 1000A will be described.

The planar light emitting device 1000B is different from the planar light emitting device 1000A in the arrangement of the light source 100 and the light reflection member 300B and in a configuration related to the connection of the light source 100. The interval between electrodes 25B on the wiring board 1B is larger than the interval between electrodes 25A on the wiring board 1A.

(Arrangement of Light Source and Light Reflection Member)

In the planar light emitting device 1000B, the light source 100 and the light reflection member 300B are arranged on the first surface 10A of the insulating resin 10 in the wiring board 1B. The light reflection member 300B is arranged so as to be interposed between the light source 100 and the wiring board 1B. As indicated by the broken line in FIG. 11, the light reflection member 300B covers the conductive paste 40 filled in the bottomed hole 51 and the conductive paste 40 arranged on the first surface 10A. The reflectance and material of the light reflection member 300B are the same as those of the light reflection member 300A.

(Connection of Light Source)

A pair of element electrodes 130 of the light source 100 are connected to the metal member 20 of the wiring board 1B via a connection member 600 provided so as to penetrate the light reflection member 300B and the wiring board 1B. The connection member 600 extends to the surface of the metal member 20 and has a region 550 connected to the surface of the metal member 20.

Since the light guide member 200 and the light adjustment member 400 are the same as those in the planar light emitting device 1000A, description thereof will be omitted.

In the planar light emitting device 1000B having the configuration as described above, the light source 100 including the light emitting element 110 is arranged on the first surface 10A side of the insulating resin 10 in the wiring board 1B, and the light reflection member 300B that covers the first surface 10A of the insulating resin 10 and the conductive paste 40 is provided. Thus, the absorption of light by the conductive paste 40 can be suppressed. Moreover, by having the light guide member 200 that covers the light source 100 and the light reflection member 300B, the light from the light source 100 can be efficiently extracted. Further, by having the light adjustment member 400 arranged in a position overlapping with the light source 100 on the surface of the light guide member 200 in a plan view, the light directly above the light source 100 on the light extraction surface of the planar light emitting device 1000B can be weakened. Therefore, the brightness of the light extraction surface can be made uniform.

Figure 12:
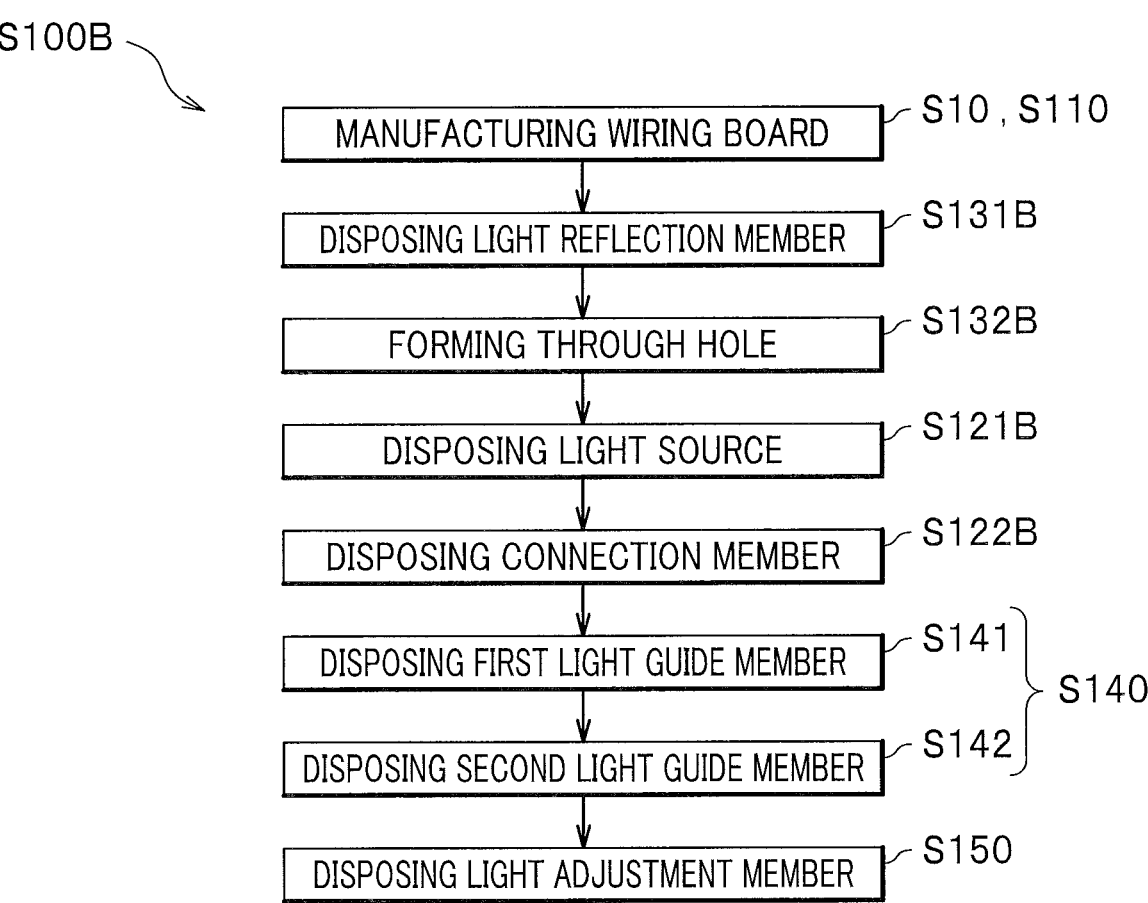
FIG. 12 is a flowchart showing a method for manufacturing a planar light emitting device according to the second embodiment.
Figure 13A:
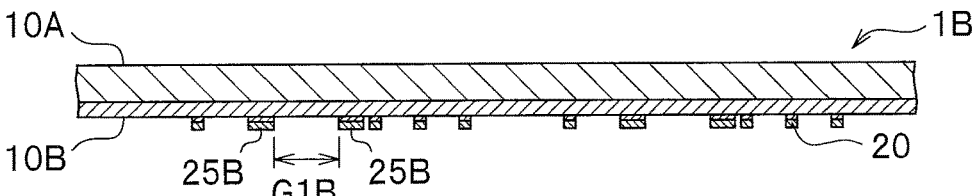
FIG. 13A is a schematic cross-sectional view showing a wiring board manufactured by the method for manufacturing a wiring board according to the embodiment in the method for manufacturing a planar light emitting device according to the second embodiment.
Figure 13B:
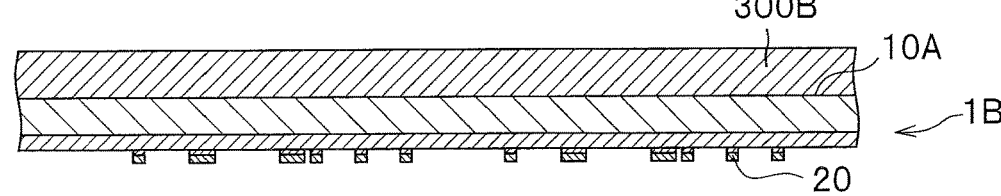
FIG. 13B is a schematic cross-sectional view showing a state where a light reflection member is arranged in the method for manufacturing a planar light emitting device according to the second embodiment.
Figure 13C:
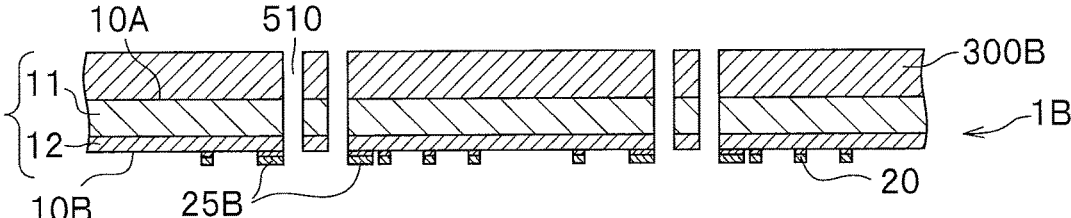
FIG. 13C is a schematic cross-sectional view showing a state where a through hole is formed in the method for manufacturing a planar light emitting device according to the second embodiment.
Figure 13D:
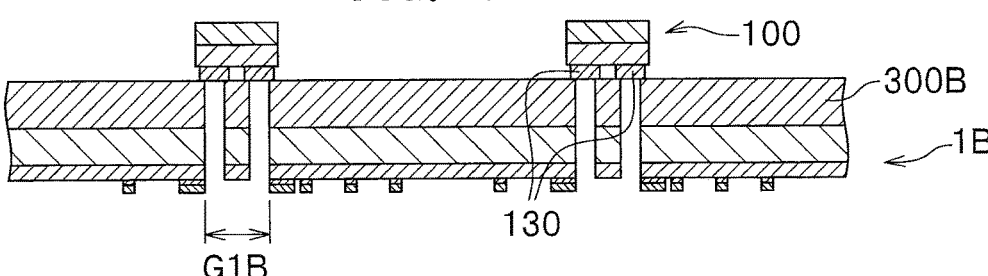
FIG. 13D is a schematic cross-sectional view showing a state where a light source is arranged in the method for manufacturing a planar light emitting device according to the second embodiment.
Figure 13E:
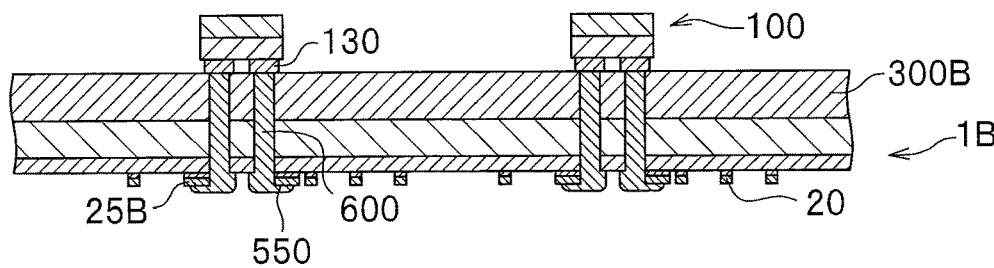
FIG. 13E is a schematic cross-sectional view showing a state where a connection member is arranged in the method for manufacturing a planar light emitting device according to the second embodiment.
Figure 13F:
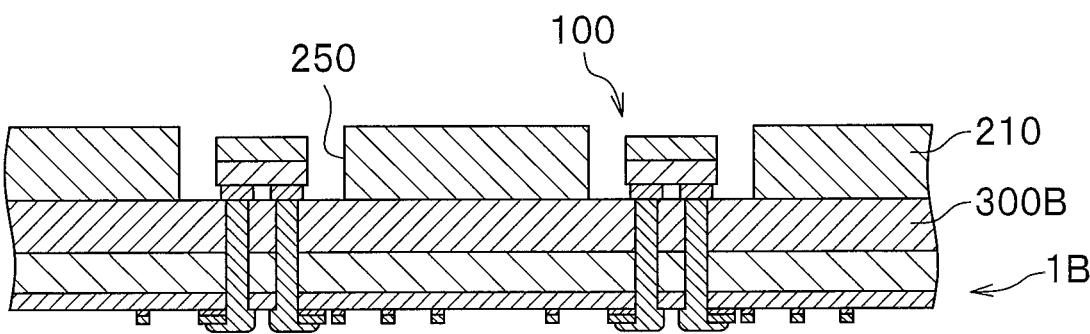
FIG. 13F is a schematic cross-sectional view showing a state where a first light guide member is arranged in the method for manufacturing a planar light emitting device according to the second embodiment.
Figure 13G:
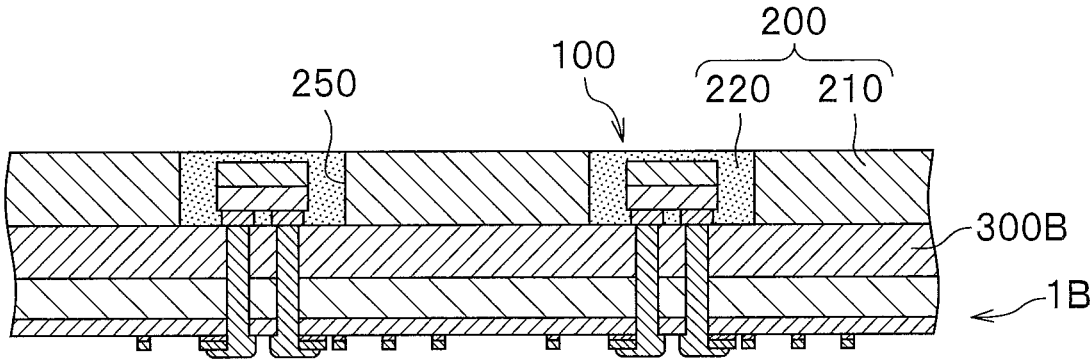
FIG. 13G is a schematic cross-sectional view showing a state where a second light guide member is arranged in the method for manufacturing a planar light emitting device according to the second embodiment.
Figure 13H:
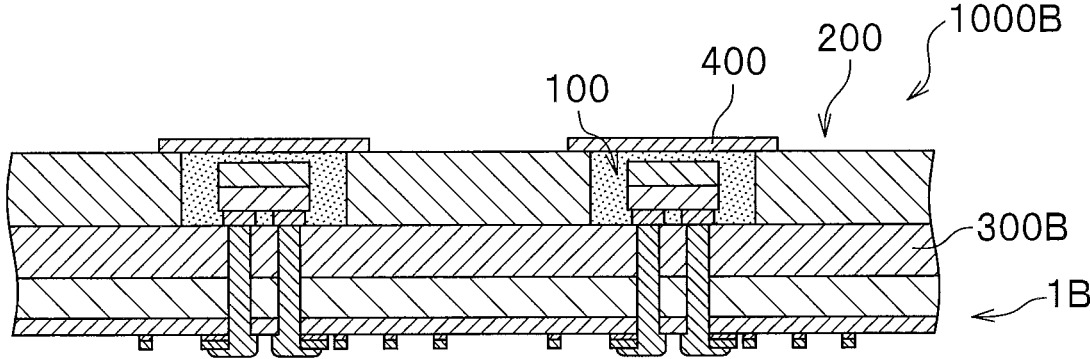
FIG. 13H is a schematic cross-sectional view showing a state where a light adjustment member is arranged in the method for manufacturing a planar light emitting device according to the second embodiment.

Next, a method S100B for manufacturing a planar light emitting device according to the second embodiment will be described with reference to FIGS. 12 to 13H. FIG. 12 is a flowchart of the method S100B for manufacturing a planar light emitting device. FIGS. 13A to 13H are schematic cross-sectional views schematically showing the method S100B for manufacturing a planar light emitting device.

The method S100B for manufacturing a planar light emitting device includes: a step S110 of manufacturing a wiring board 1B by the method S10 for manufacturing a wiring board; a step S131B of disposing a light reflection member 300B so as to cover the first surface 10A of the insulating resin 10 and the conductive paste 40 in the wiring board 1B; a step S121B of disposing a light source 100 including a light emitting element 110 on the first surface 10A side of the insulating resin 10; a step S140 of disposing a light guide member 200 so as to cover the light source 100 and the light reflection member 300B; and a step S150 of disposing a light adjustment member 400 in a position overlapping with the light source 100 on the surface of the light guide member 200 in a plan view. Here, the method S100B for manufacturing a planar light emitting device further includes a step S132B of forming a through hole 510 and a step S122B of disposing a connection member 600. The step S140 of disposing the light guide member 200 and the step S150 of disposing the light adjustment member 400 are omitted since they are the same as those in the method S100A for manufacturing a planar light emitting device, and description thereof is redundant.

(Manufacturing Wiring Board)

The step S110 of manufacturing a wiring board is a step of manufacturing a wiring board 1B by the method S10 for manufacturing a wiring board. In FIG. 13A, the first surface 10A side of the insulating resin 10 is the upper surface in the drawing. Here, the interval between electrodes 25B is an interval G1B larger than that of the wiring board 1A. The conductive paste 40 is arranged on the wiring board 1B, but is not shown in the cross section in FIGS. 13A to 13H.

(Disposing Light Reflection Member)

The step S131B of disposing a light reflection member is a step of arranging the light reflection member 300B so as to cover the first surface 10A of the insulating resin 10 and the conductive paste 40. In this step S131B, the light reflection member 300B does not have an opening formed therein that surrounds the light source 100. In this step S131B, the light reflection member 300B can be arranged so as to cover the entire surface of the wiring board 1B. In this step S131B, the light reflection member 300B covers the conductive paste 40 filled in the bottomed hole 51 and the conductive paste 40 arranged on the first surface 10A at positions not shown in FIGS. 13B to 13H.

An adhesive sheet is attached to the upper and lower surfaces of the light reflection member 300B as in the case of the light reflection member 300A. The upper surface of the light reflection member 300B in FIGS. 13B to 13H has adhesiveness. This adhesiveness makes it possible to hold the pair of element electrodes 130 and fix the light source

100 in the step S121B of disposing a light source to be described later. The light reflection member 300B can be provided by applying an adhesive instead of using the adhesive sheet. The light reflection member 300B is bonded and then pressurized toward the wiring board 1B while being heated. As a result, the surface of the light reflection member 300B on the upper surface side that does not face the wiring board 1B becomes fluid, making it easier to perform drilling and to arrange the light source in the subsequent steps.

(Forming Through Hole)

The step S132B of forming a through hole is a step of forming the through hole 510 that penetrates the light reflection member 300B and the wiring board 1B. In this step S132B, the through hole 510 is formed so as to penetrate the light reflection member 300B and the insulating resin 10 at a position facing the pair of element electrodes 130 of the light source 100 arranged in a subsequent step. The electrode 25B is located so as to come into contact with the opening on the second surface 10B side of the insulating resin 10 of the through hole 510.

In the step S132B of forming a through hole, the through hole 510 can be formed from the light reflection member 300B side or from the second surface 10B side of the insulating resin 10. The through hole 510 can be formed by laser machining or drilling.

(Disposing Light Source)

The step S121B of disposing a light source is a step of arranging the light source 100 on the light reflection member 300B. In this step S121B, the light source 100 is arranged so that the pair of element electrodes 130 face the through hole 510. In this step S121B, the interval G1B can be an interval between two through holes 510, for example. As described above, the upper surface of the light reflection member 300B in FIGS. 13B to 13H has adhesiveness, making it possible to fix the light source 100 until it is connected by the connection member 600 in the step S122B of disposing a connection member.

(Disposing Connection Member)

The step S122B of disposing a connection member is a step of filling the through hole 510 with the connection member 600 and arranging the connection member on the surface of the electrode 25B. In this step S122B, the connection member 600 is filled in the through hole 510 to connect the pair of element electrodes 130 and the electrodes 25B.

In the step S122B of disposing the connection member, the connection member 600 is arranged so as to extend on the surface of the electrode 25B after filling the through hole 510. The step S122B of disposing the connection member can ensure the electrical connection by providing a region 550 where the connection member 600 is connected to the surface of the electrode 25B. As the material of the connection member 600, the same material as the conductive paste 40 or solder can be used.

In the method S100B for manufacturing a planar light emitting device having the configuration as described above, the manufacturing time and the number of steps for manufacturing the wiring board can be reduced by the method S10 for manufacturing a wiring board. By disposing the light reflection member 300B so as to cover the first surface 10A of the insulating resin 10 and the conductive paste 40 and by disposing the light source 100 on the first surface 10A side of the insulating resin 10, the light reflection member 300B can be arranged closer to the light source 100, making it possible to improve the light extraction efficiency.

Further, in the method S100B for manufacturing a planar light emitting device, the light guide member 200 is arranged so as to cover the light source 100 and the light reflection member 300B, and the light adjustment member 400 is arranged at a position overlapping with the light source 100 on the surface of the light guide member 200 in a plan view. Thus, the manufacturing time and the number of steps for manufacturing the planar light emitting device can be further reduced while suppressing an increase in the number of members.

What is claimed is:

1. A method for manufacturing a wiring board, the method comprising:

preparing a substrate including an insulating resin having a first surface and a second surface on an opposite side to the first surface, and a metal member having an anti-rust layer formed on a surface thereof that is arranged so as to face the second surface of the insulating resin;

forming a bottomed hole by irradiating a first laser beam from the first surface side of the insulating resin, the bottomed hole penetrating the insulating resin and having an inner bottom surface that is the surface of the metal member;

removing the anti-rust layer formed on the surface of the metal member in the inner bottom surface of the bottomed hole;

injecting a conductive paste into the bottomed hole and applying the conductive paste to the first surface of the insulating resin so as to have a wiring continuous with the injected conductive paste; and curing the conductive paste, wherein the removing of the anti-rust layer formed on the surface of the metal member in the inner bottom surface of the bottomed hole includes irradiating a central portion of the inner bottom surface of the bottomed hole with a second laser beam having a larger energy than the first laser beam, and in a region where the anti-rust layer is removed, the metal member has a surface roughness (Ra) of 0.1 μm to 3.0 μm.

2. The method for manufacturing a wiring board according to claim 1, wherein in the injecting and applying of the conductive paste, the conductive paste is injected and applied through an opening of a mask, and when viewed in a plan view, an area where the opening of the mask overlaps with an opening of the bottomed hole is 40% to 70% of an area of the opening of the bottomed hole.

3. The method for manufacturing a wiring board according to claim 1, wherein the first laser beam and the second laser beam are irradiated using a same laser.

4. The method for manufacturing a wiring board according to claim 1, wherein the first laser beam and the second laser beam are irradiated by using a $CO_2$ laser.

5. The method for manufacturing a wiring board according to claim 1, wherein the removing of the anti-rust layer formed on the surface of the metal member in the inner bottom surface of the bottomed hole includes irradiating a central portion of the inner bottom surface of the bottomed hole with a third laser beam having a wavelength shorter than a wavelength of the first laser beam.

6. The method for manufacturing a wiring board according to claim 1, wherein the removing of the anti-rust layer formed on the surface of the metal member in the inner bottom surface of the bottomed hole includes grinding the inner bottom surface of the bottomed hole with a needle-shaped tool.

7. The method for manufacturing a wiring board according to claim 1, wherein the injecting and applying of the conductive paste is carried out by adding a reducing agent to the conductive paste.

8. The method for manufacturing a wiring board according to claim 1, wherein the forming of the bottomed hole includes forming the bottomed hole so that an inner diameter of the bottomed hole increases from the second surface side of the insulating resin toward the first surface side of the insulating resin.

9. The method for manufacturing a wiring board according to claim 1, wherein the forming of the bottomed hole includes forming a plurality of bottomed holes in parallel having the inner bottom surface that is the surface of the metal member, and in the injecting and applying of the conductive paste, the conductive paste in contact with the inner bottom surface of the plurality of bottomed holes formed in parallel is made continuous through the conductive paste on the first surface.

10. The method for manufacturing a wiring board according to claim 1, wherein the bottomed hole has a maximum diameter of 100 μm to 500 μm.

11. A method for manufacturing a planar light emitting device, the method comprising:

manufacturing the wiring board by the method according to claim 1;

disposing a light source including a light emitting element on the metal member of the wiring board;

disposing a light reflection member so as to cover the metal member; and disposing a first light guide member so as to cover the light reflection member.

12. A method for manufacturing a planar light emitting device, the method comprising:

manufacturing the wiring board by the method according to claim 1;

disposing a light reflection member so as to cover the first surface of the insulating resin and the conductive paste of the wiring board;

disposing a light source including a light emitting element on the first surface side of the insulating resin;

disposing a light guide member so as to cover the light source and the light reflection member; and disposing a light adjustment member in a position overlapping with the light source on a surface of the light guide member when viewed in a plan view.

13. A wiring board comprising:

a substrate including an insulating resin having a first surface and a second surface on an opposite side to the first surface, and a metal member having an anti-rust layer formed on a surface thereof that is arranged so as to face the second surface of the insulating resin; and a conductive paste disposed on the substrate, wherein the anti-rust layer has a thickness of 0.1 m to 7 um, the substrate has a bottomed hole that penetrates the insulating resin and has an inner bottom surface that is the surface of the metal member, the inner bottom surface of the bottomed hole has a region where the anti-rust layer is removed, an area of the region where the anti-rust layer is removed is 20% to 80% with respect to the inner bottom surface of the bottomed hole, the conductive paste is positioned inside the bottomed hole so as to face the region where the anti-rust layer is removed, the conductive paste is arranged on the first surface of the insulating resin so as to have a wiring continuous with the conductive paste positioned inside the bottomed hole, and in the region where the anti-rust layer is removed, the metal member has a surface roughness (Ra) of 0.1 µm to 3.0 µm.

14. The wiring board according to claim 13, wherein the substrate has a plurality of bottomed holes arranged in parallel, each bottomed hole of the plurality of bottomed holes having an inner bottom surface that is the surface of the metal member, and the conductive paste in contact with each of the inner bottom surfaces of the plurality of bottomed holes arranged in parallel is continuous via the wiring of the conductive paste arranged on the first surface of the insulating resin.

15. A planar light emitting device comprising:

the wiring board according to claim 13;

a light source including a light emitting element disposed on the metal member;

a light reflection member that covers the metal member; and a first light guide member that covers the light reflection member.

16. A planar light emitting device comprising:

the wiring board according to claim 13;

a light reflection member that covers the first surface of the insulating resin and the conductive paste;

a light source including a light emitting element disposed on the first surface side of the insulating resin;

a light guide member that covers the light source and the light reflection member; and a light adjustment member arranged in a position overlapping with the light source on the surface of the light guide member when viewed in a plan view.

17. The method for manufacturing a wiring board according to claim 1, wherein the second laser beam is irradiated in the central portion of the inner bottom surface away from an inner side surface of the bottomed hole.

18. The method for manufacturing a wiring board according to claim 1, wherein a maximum diameter of a region irradiated with the second laser beam is 20 µm to 300 µm.

19. The wiring board according to claim 13, wherein the region where the anti-rust layer is removed in the inner bottom surface of the bottomed hole is a central portion of the inner bottom surface away from an inner side surface of the bottomed hole.

20. A method for manufacturing a wiring board, the method comprising:

preparing a substrate including an insulating resin having a first surface and a second surface on an opposite side to the first surface, and a metal member having an anti-rust layer formed on a surface thereof that is arranged so as to face the second surface of the insulating resin;

forming a bottomed hole by irradiating a first laser beam from the first surface side of the insulating resin, the bottomed hole penetrating the insulating resin and having an inner bottom surface that is the surface of the metal member;

removing the anti-rust layer formed on the surface of the metal member in the inner bottom surface of the bottomed hole;

injecting a conductive paste into the bottomed hole and applying the conductive paste to the first surface of the insulating resin so as to have a wiring continuous with the injected conductive paste; and curing the conductive paste, wherein the injecting and applying of the conductive paste is carried out by adding a reducing agent to the conductive paste.

* * * * *